(12) United States Patent
Saitoh et al.

(10) Patent No.: US 12,527,208 B2
(45) Date of Patent: Jan. 13, 2026

(54) DISPLAY DEVICE

(71) Applicant: SHARP KABUSHIKI KAISHA, Sakai (JP)

(72) Inventors: Takao Saitoh, Sakai (JP); Yohsuke Kanzaki, Sakai (JP); Masaki Yamanaka, Sakai (JP); Yi Sun, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 434 days.

(21) Appl. No.: 18/015,032

(22) PCT Filed: Jul. 22, 2020

(86) PCT No.: PCT/JP2020/028396
§ 371 (c)(1),
(2) Date: Jan. 6, 2023

(87) PCT Pub. No.: WO2022/018846
PCT Pub. Date: Jan. 27, 2022

(65) Prior Publication Data
US 2023/0276667 A1    Aug. 31, 2023

(51) Int. Cl.
*H10K 59/80* (2023.01)
*H10K 59/123* (2023.01)
*H10K 59/131* (2023.01)
*H10K 59/65* (2023.01)

(52) U.S. Cl.
CPC ......... *H10K 59/873* (2023.02); *H10K 59/123* (2023.02); *H10K 59/131* (2023.02); *H10K 59/8722* (2023.02); *H10K 59/8731* (2023.02); *H10K 59/65* (2023.02)

(58) Field of Classification Search
None
See application file for complete search history.

(56) References Cited

U.S. PATENT DOCUMENTS

| | | | |
|---|---|---|---|
| 2005/0140306 A1* | 6/2005 | Park | H10K 59/127 315/169.3 |
| 2017/0288003 A1 | 10/2017 | Kim et al. | |
| 2019/0051859 A1 | 2/2019 | Choi et al. | |
| 2020/0067017 A1 | 2/2020 | Seo et al. | |
| 2020/0303677 A1* | 9/2020 | Lee | H10K 59/131 |
| 2022/0077419 A1* | 3/2022 | Hwang | H10K 50/8426 |

FOREIGN PATENT DOCUMENTS

| | | |
|---|---|---|
| CN | 110911421 A | 3/2020 |
| JP | 2019035950 A | 3/2019 |

\* cited by examiner

*Primary Examiner* — Feifei Yeung Lopez
(74) *Attorney, Agent, or Firm* — ScienBiziP, P.C.

(57) ABSTRACT

A display device includes a base substrate, a thin film transistor layer and a light-emitting element layer. An insular non-display area is provided internal to a display area. A through hole extends in a direction of a thickness of the base substrate in a non-display area. A separation wall is provided in the non-display area so as to surround the through hole. The separation wall includes: a wall base portion made of a same material and in a same layer as a planarization film and provided like a frame; and a wall top portion made of a same material and in a same layer as an inorganic insulation film and provided on the wall base portion like a brim projecting from a display area side toward a through hole side.

13 Claims, 13 Drawing Sheets

DISPLAY DEVICE

TECHNICAL FIELD

The disclosure relates to display devices.

BACKGROUND ART

The organic EL display device, or the self-luminous display device built around organic electroluminescence (may be referred to as "EL" in the following) elements, has been attracting attention as an alternative to the liquid crystal display device. In this context, the organic EL element includes, for example: an organic EL layer as a functional layer; a first electrode disposed on one of the surfaces of the organic EL layer; and a second electrode disposed on the other surface of the organic EL layer. To install, for example, electronic components such as a camera and/or a fingerprint sensor in a display area of this organic EL display device where an image display is produced, a structure is being proposed that includes an insular non-display area having a through hole extending thickness-wise through the non-display area (see, for example, Patent Literature 1).

CITATION LIST

Patent Literature

Patent Literature 1: Japanese Unexamined Patent Application Publication, Tokukai, No. 2019-35950

SUMMARY

Technical Problem

The disclosure has an object to form a common functional layer at low cost by separating into a display area side and a through hole side.

Solution to Problem

To achieve this object, the disclosure is directed to a display device including: a base substrate; a thin film transistor layer on the base substrate, a planarization film and an inorganic insulation film being sequentially stacked on the thin film transistor layer; and a light-emitting element layer on the thin film transistor layer, the light-emitting element layer including a plurality of first electrodes, a plurality of functional layers, and a common, second electrode sequentially stacked in such a manner as to correspond to a plurality of subpixels in a display area, wherein an insular non-display area is provided internal to the display area, a through hole extends in a direction of a thickness of the base substrate in the non-display area, a separation wall is provided so as to surround the through hole in the non-display area, and the separation wall includes: a wall base portion made of a same material and in a same layer as the planarization film and provided like a frame; and a wall top portion made of a same material and in a same layer as the inorganic insulation film and provided on the wall base portion like a brim projecting from a display area side toward a through hole side.

Advantageous Effects of Disclosure

The disclosure is capable of forming a common functional layer at low cost by separating into a display area side and a through hole side.

DESCRIPTION OF EMBODIMENTS

The following will describe embodiments of the disclosure with reference to drawings. Note that the disclosure is not limited to the embodiments described below.

FIRST EMBODIMENT

Figure 1:
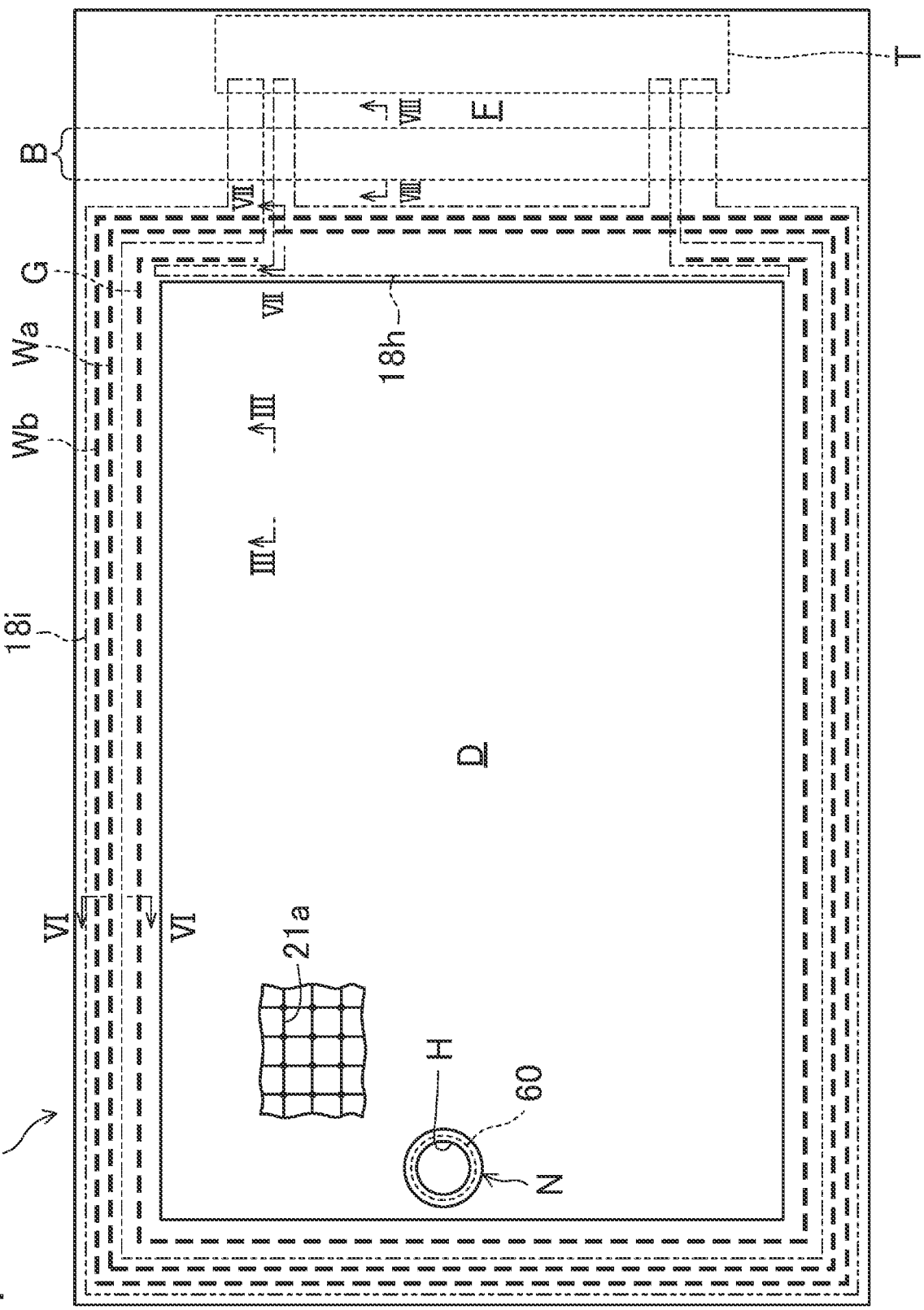
FIG. 1 is a schematic plan view of a structure of an organic EL display device in accordance with a first embodiment of the disclosure.
Figure 2:
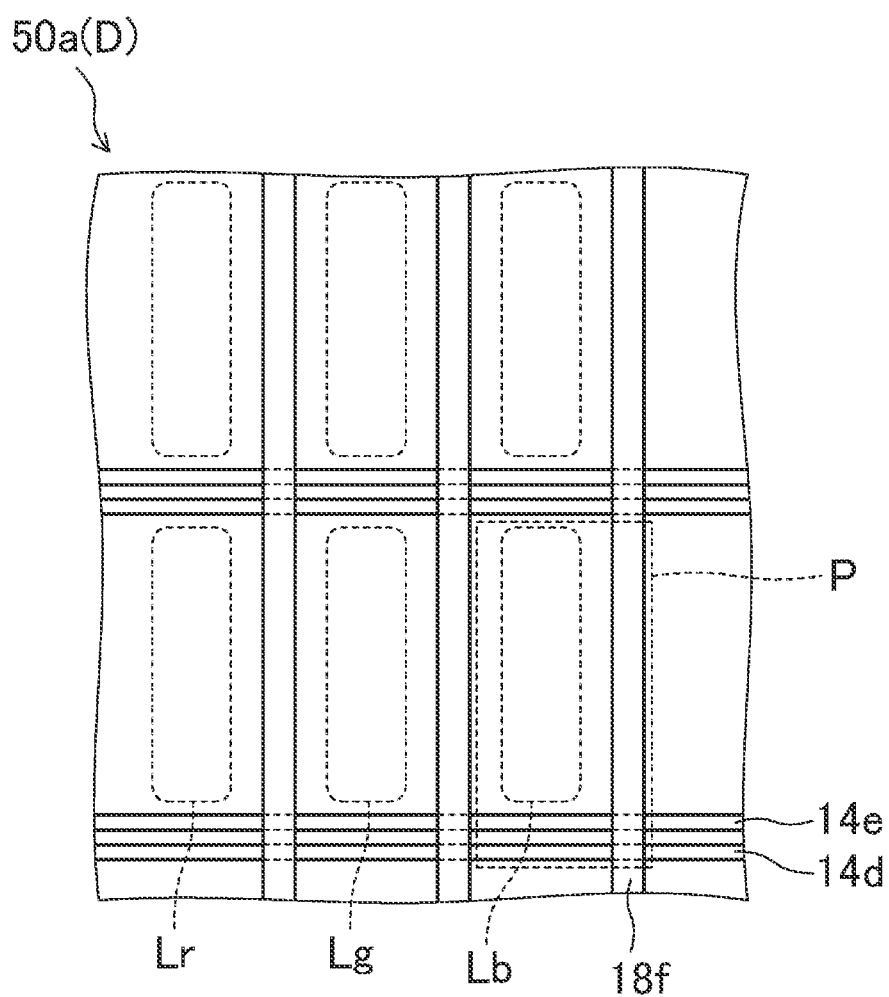
FIG. 2 is a plan view of a display area of the organic EL display device in accordance with the first embodiment of the disclosure.
Figure 3:
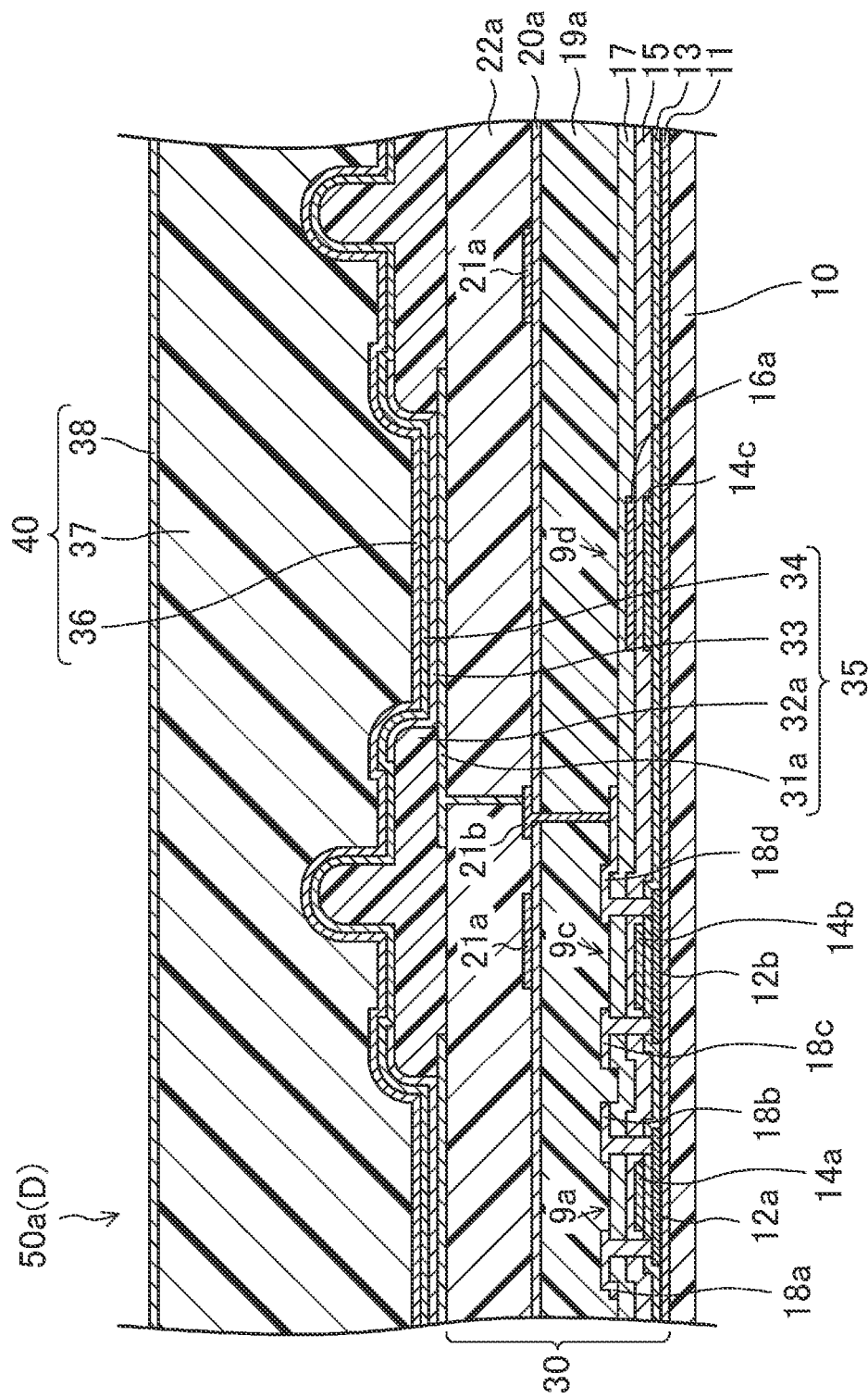
FIG. 3 is a cross-sectional view of the display area of the organic EL display device, taken along line III-III shown in FIG. 1.
Figure 4:
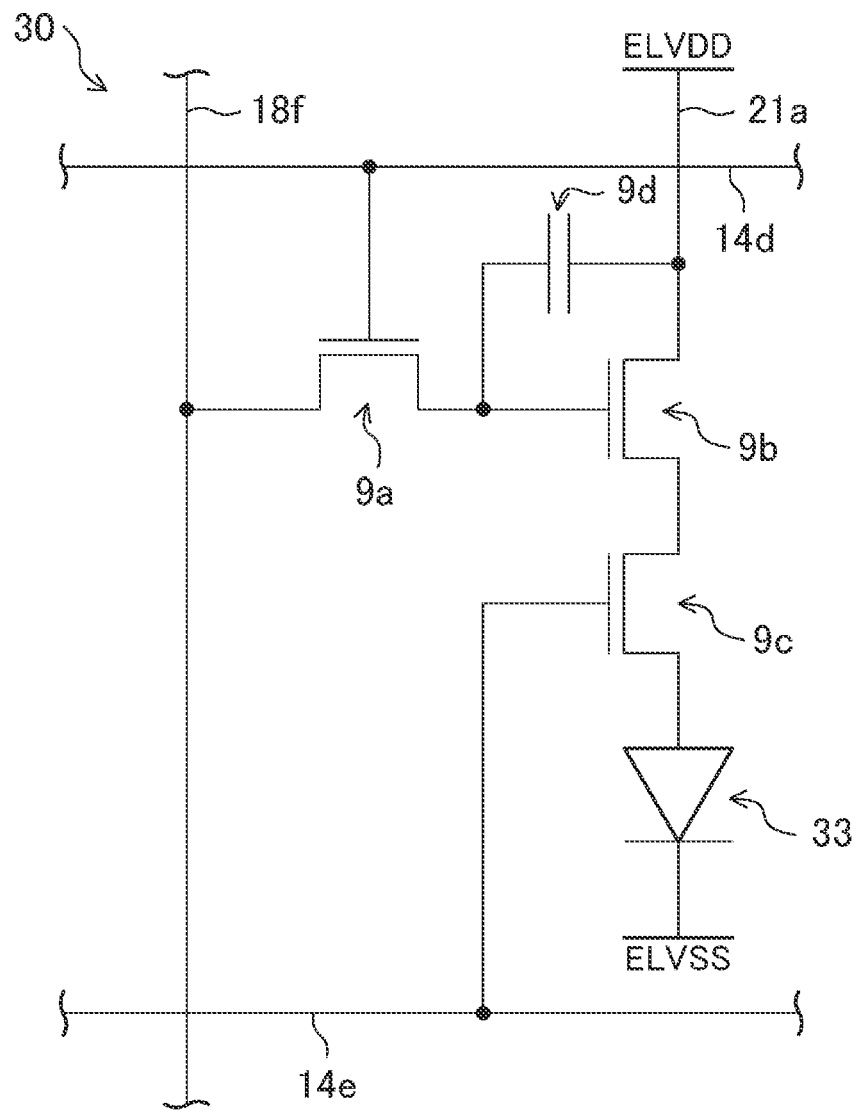
FIG. 4 is an equivalent circuit diagram of a TFT layer in the organic EL display device in accordance with the first embodiment of the disclosure.
Figure 5:
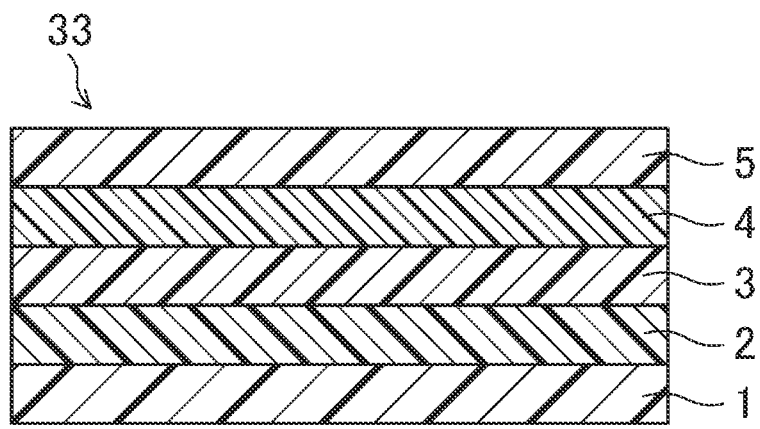
FIG. 5 is a cross-sectional view of an organic EL layer in the organic EL display device in accordance with the first embodiment of the disclosure.
Figure 6:
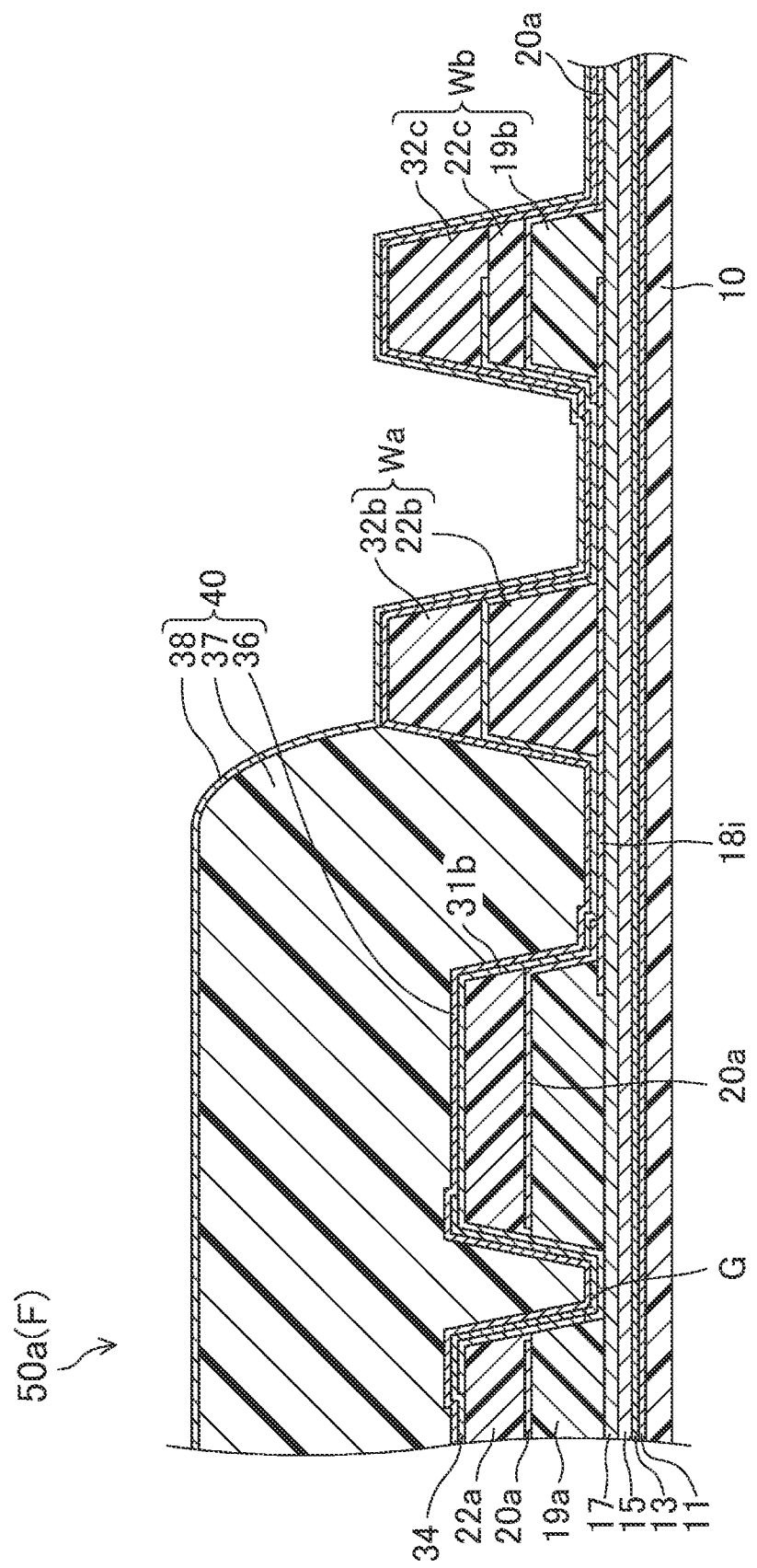
FIG. 6 is a cross-sectional view of a frame area of the organic EL display device, taken along line VI-VI shown in FIG. 1.
Figure 7:
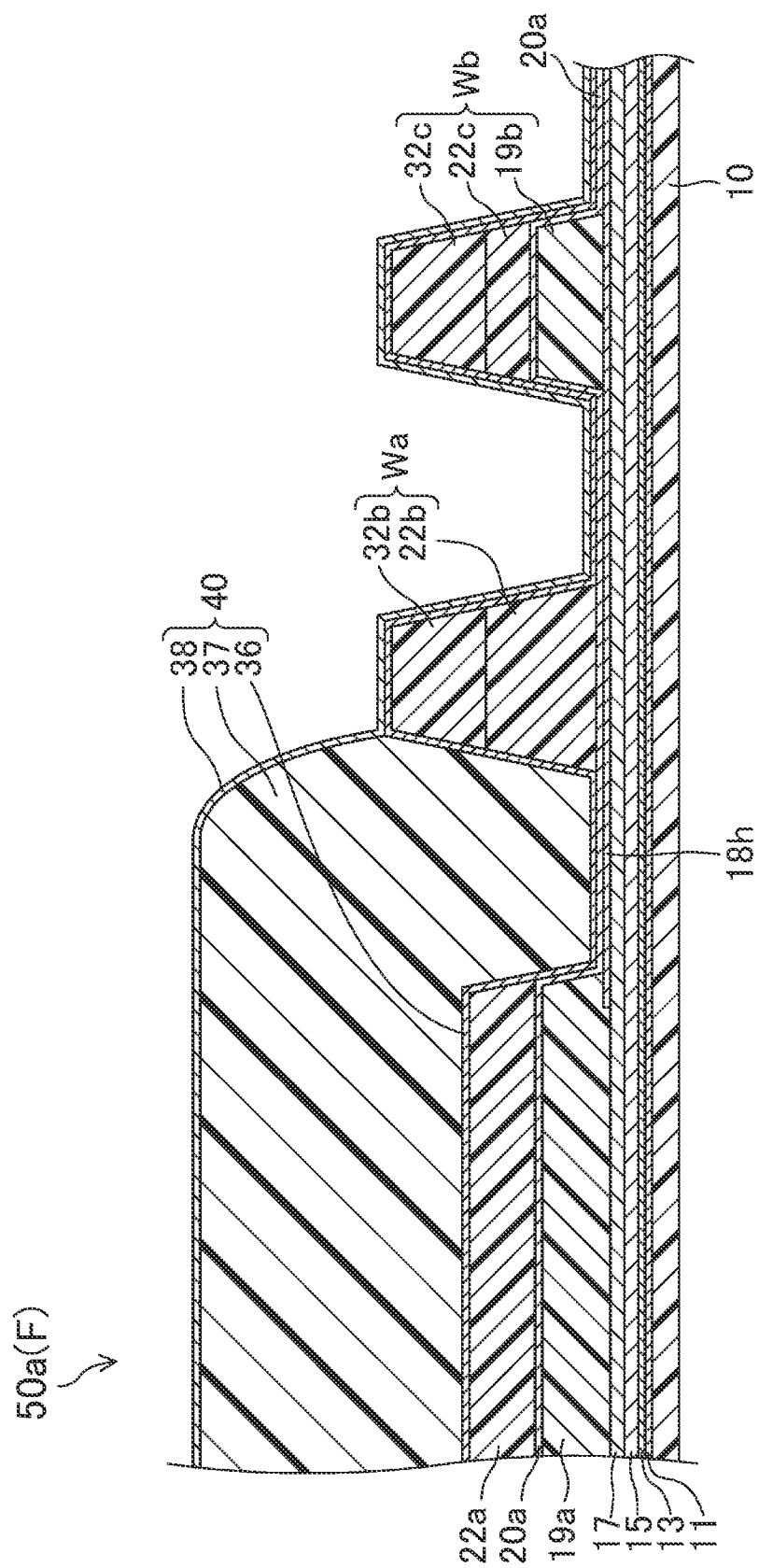
FIG. 7 is a cross-sectional view of the frame area of the organic EL display device, taken along line VII-VII shown in FIG. 1.
Figure 8:
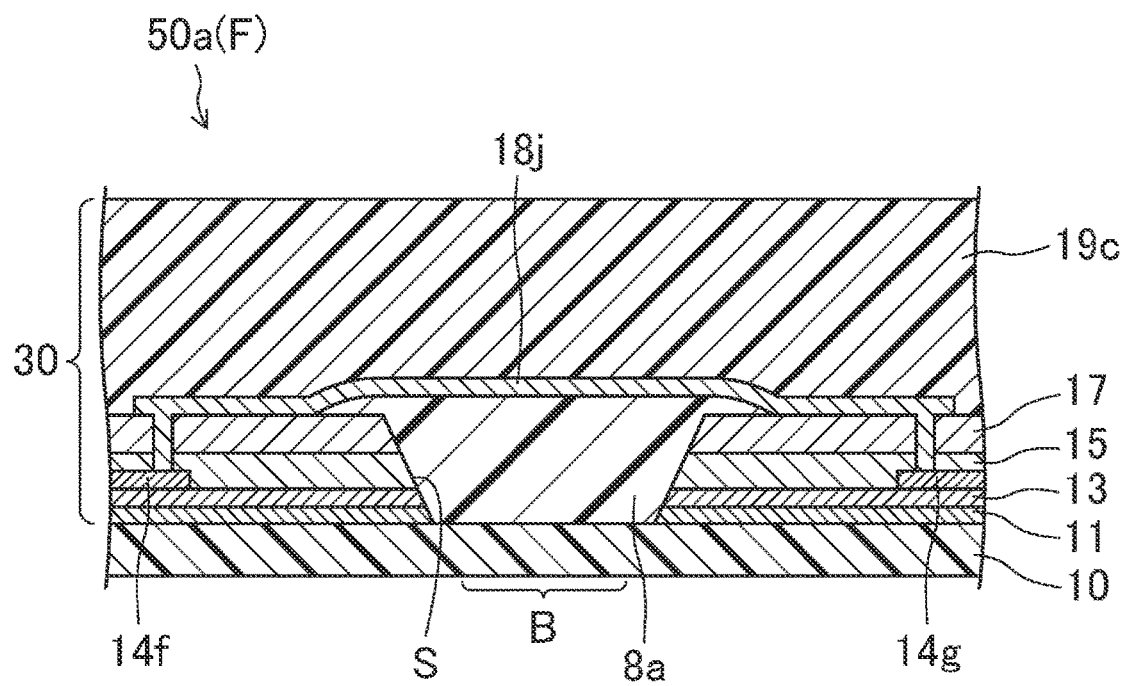
FIG. 8 is a cross-sectional view of the frame area of the organic EL display device, taken along line VIII-VIII shown in FIG. 1.
Figure 9:
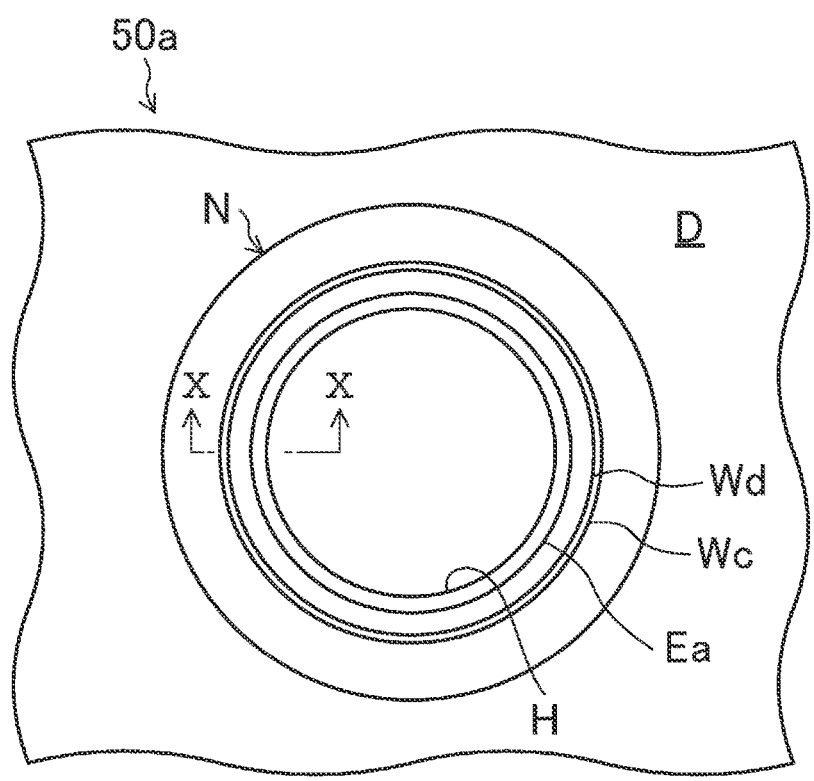
FIG. 9 is a plan view of a non-display area and its surrounding structure of the organic EL display device in accordance with the first embodiment of the disclosure.
Figure 10:
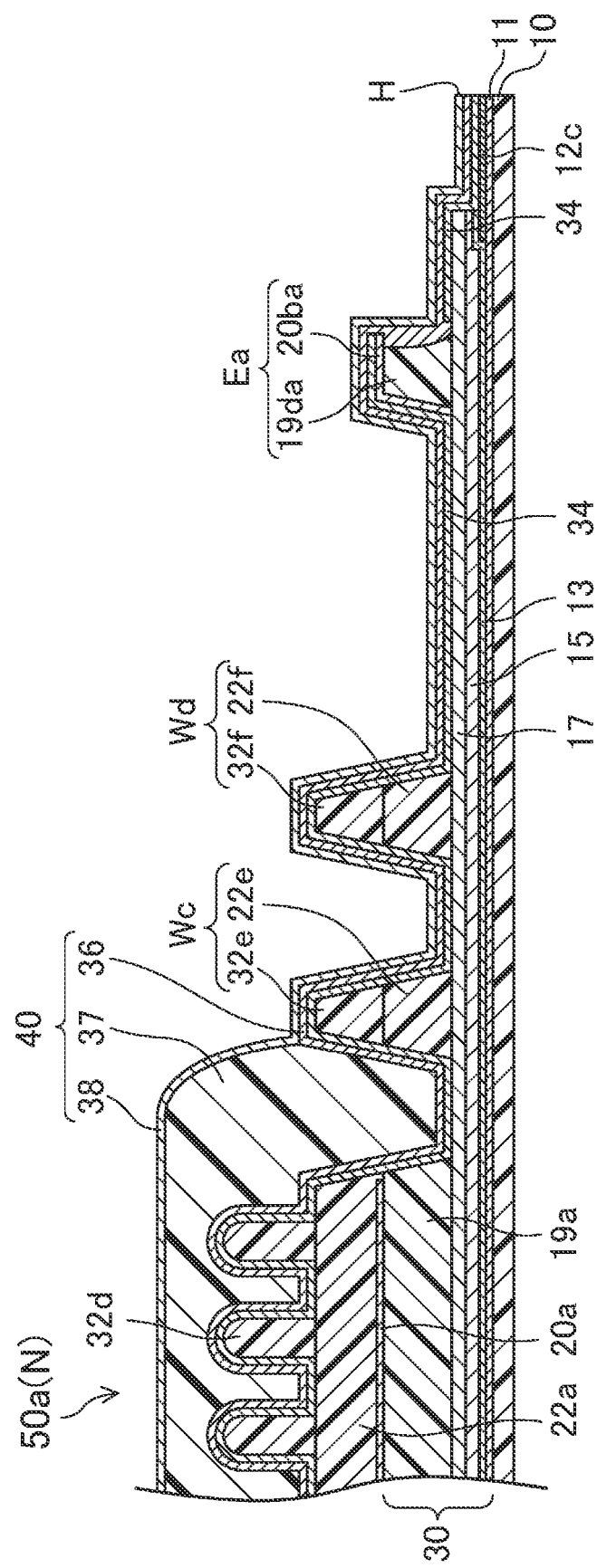
FIG. 10 is a cross-sectional view of the non-display area of the organic EL display device, taken along line X-X shown in FIG. 9.

FIGS. 1 to 12 represent a first embodiment of the display device of the disclosure. Note that the following embodiments will discuss an organic EL display device including organic EL elements as an example of a display device including light-emitting elements. Here, FIG. 1 is a schematic plan view of a structure of an organic EL display device 50a in accordance with the present embodiment. In addition, FIG. 2 is a plan view of a display area D of the organic EL display device 50a. In addition, FIG. 3 is a cross-sectional view of the display area D of the organic EL display device 50a, taken along line III-III shown in FIG. 1. In addition, FIG. 4 is an equivalent circuit diagram of a TFT layer 30 in the organic EL display device 50a. In addition, FIG. 5 is a cross-sectional view of one of organic EL layers 33 in the organic EL display device 50a. In addition, FIGS. 6, 7, and 8 are cross-sectional views of a frame area F of the organic EL display device 50a, taken respectively along line VI-VI, line VII-VII, and line VIII-VIII all shown in FIG. 1. In addition, FIG. 9 is a plan view of a non-display area N and its surrounding structure of the organic EL display device 50a. In addition, FIG. 10 is a cross-sectional view of the non-display area N of the organic EL display device 50a, taken along line X-X shown in FIG. 9.

The organic EL display device 50a, as shown in FIG. 1, includes, for example: the rectangular display area D for image displays; and the frame area F shaped like a rectangular frame surrounding the display area D. Note that in the present embodiment, the rectangular display area D is described as an example. This "rectangular" shape encompasses, for example, generally rectangular shapes including those with a curved side(s), those with a round corner(s), and those with a notched side(s).

In the display area D, as shown in FIG. 2, there is provided a matrix of subpixels P. Additionally, in the display area D are there provided, for example, subpixels P each of which includes a red-light-emission region Lr for producing a red display, subpixels P each of which includes a green-light-emission region Lg for producing a green display, and subpixels P each of which includes a blue-light-emission region Lb for producing a blue display. Three subpixels, one from each of these three types of subpixels P, are arranged adjacent to each other as shown in FIG. 2. Note that in the display area D, a single pixel is composed of, as an example, three adjacent subpixels P that include one red-light-emission region Er, one green-light-emission region Eg, and one blue-light-emission region Eb. Additionally, the insular non-display area N is provided in the display area D as shown in FIG. 1. Here, as shown in FIG. 1, there is provided a through hole H extending in the direction of the thickness of a resin substrate layer 10 (detailed later) through the non-display area N, to install, for example, electronic components 60 such as a camera and/or a fingerprint sensor. Note that the structure and other specifics of the non-display area N will be detailed later with reference to FIGS. 9 and 10.

There is provided a terminal section T extending in one direction (vertical direction in the drawing) in the far right side of the frame area F in FIG. 1. In addition, in the frame area F, as shown in FIG. 1, a bending portion B that is bendable, for example, by 180° (into a U-shape) about the vertical direction in the drawing as the bending axis is provided between the display area D and the terminal section T so as to extend in one direction (vertical direction in the drawing). In addition, the terminal section T includes a plurality of terminals extending in the direction in which the terminal section extends. Also, in the frame area F, in a first planarization film 19a and a second planarization film 22a (both detailed later), as shown in FIGS. 1 and 6, there is provided a trench G, generally C-shaped in a plan view, that runs through the first planarization film 19a and the second planarization film 22a. Here, the trench G is shaped generally like a letter C in such a manner that the trench G is open on the terminal section T side thereof in a plan view as shown in FIG. 1.

The organic EL display device 50a, as shown in FIG. 3, includes: the resin substrate layer 10 as a base substrate; the thin film transistor (hereinafter may be alternatively referred to as a TFT) layer 30 on the resin substrate layer 10; an organic EL element layer 35 as a light-emitting element layer on the TFT layer 30; and a sealing film 40 on the organic EL element layer 35.

The resin substrate layer 10 is made of, for example, an organic resin material such as a polyimide resin.

The TFT layer 30, as shown in FIG. 3, includes: a base coat film 11 on the resin substrate layer 10; and a plurality of first TFTs 9a, a plurality of second TFTs 9b (see FIG. 4), a plurality of third TFTs 9c, and a plurality of capacitors 9d on the base coat film 11. The TFT layer 30, as shown in FIG. 3, further includes: the first planarization film 19a, a third interlayer insulation film 20a, and the second planarization film 22a, all of which are sequentially provided on each first TFT 9a, each second TFT 9b, each third TFT 9c, and each capacitor 9d.

The TFT layer 30, as shown in FIG. 3, includes: semiconductor layers 12a and 12b; a gate insulation film 13; gate electrodes 14a and 14b and a lower conductive layer 14c; a first interlayer insulation film 15; an upper conductive layer 16a; a second interlayer insulation film 17; source electrodes 18a and 18c and drain electrodes 18b and 18d; the first planarization film 19a; the third interlayer insulation film 20a; power supply lines 21a and relay electrodes 21b; and the second planarization film 22a, all of which are sequentially stacked on the base coat film 11.

The TFT layer 30, in the display area D, includes, as a wiring layer, a plurality of gate lines 14d extending parallel to each other in the horizontal direction in the drawing as shown in FIGS. 2 and 4. The TFT layer 30, in the display area D, further includes, as a wiring layer, a plurality of light-emission control lines 14e extending parallel to each other in the horizontal direction in the drawing as shown in FIGS. 2 and 4. Note that the gate lines 14d and the light-emission control lines 14e are made of the same material and in the same layer as the gate electrodes 14a and 14b and the lower conductive layer 14c. Additionally, each light-emission control line 14e is provided adjacent to each gate line 14d as shown in FIG. 2. The TFT layer 30, in the display area D, further includes, as a wiring layer, a plurality of source lines 18f extending parallel to each other in the vertical direction in the drawing as shown in FIGS. 2 and 4. Note that the source lines 18f are made of the same material and in the same layer as the source electrodes 18a and 18c and the drain electrodes 18b and 18d. The TFT layer 30, in the display area D, further includes the power supply lines 21a in a lattice form as shown in FIG. 1. Additionally, in the ITT layer 30, each subpixel P includes one of the first TFTs 9a, one of the second TFTs 9b, one of the third TFTs 9c, and one of the capacitors 9d as shown in FIG. 4.

The base coat film 11, the gate insulation film 13, the first interlayer insulation film 15, and the second interlayer insulation film 17 are provided as additional inorganic insulation films and made of, for example, a monolayer film of, for example, silicon nitride, silicon oxide, or silicon oxynitride or a stack of any of these monolayer films.

In each subpixel P, the first TFT 9a is electrically connected to an associated one of the gate lines 14d, an associated one of the source lines 18f, and an associated one of the second TFTs 9b as shown in FIG. 4. In addition, the first TFT 9a includes the semiconductor layer 12a, the gate insulation film 13, the gate electrode 14a, the first interlayer insulation film 15, the second interlayer insulation film 17, and the source electrode 18a and the drain electrode 18b, all of which are sequentially provided on the base coat film 11, as shown in FIG. 3. Here, the semiconductor layer 12a is provided on the base coat film 11 as shown in FIG. 3 and has a channel region, a source region, and a drain region as will be described later. In addition, the semiconductor layer 12a and the semiconductor layer 12b (detailed later) are made of, for example, a low-temperature polysilicon film or an In—Ga—Zn—O-based oxide semiconductor film. In addition, the gate insulation film 13 is provided so as to cover the semiconductor layer 12a as shown in FIG. 3. In addition, the gate electrode 14a is provided on the gate insulation film 13 so as to overlap the channel region of the semiconductor layer 12a as shown in FIG. 3. In addition, the first interlayer insulation film 15 and the second interlayer insulation film 17 are sequentially provided so as to cover the gate electrode 14a as shown in FIG. 3. In addition, the source electrode 18a and the drain electrode 18b are provided on the second interlayer insulation film 17 so as to be separated by a distance from each other as shown in FIG. 3. In addition, the source electrode 18a and the drain electrode 18b are electrically connected respectively to the source region and the drain region of the semiconductor layer 12a via contact holes formed through a stack of the gate insulation film 13, the first interlayer insulation film 15, and the second interlayer insulation film 17 as shown in FIG. 3.

In each subpixel P, the second TFT 9b is electrically connected to an associated one of the first TFTs 9a, an associated one of the power supply lines 21a, and an associated one of the third TFTs 9c as shown in FIG. 4. Note that the second TFT 9b has substantially the same structure as the first TFT 9a and the third TFT 9c (which is described later).

In each subpixel P, the third TFT 9c is electrically connected to an associated one of the second TFTs 9a, an associated one of the power supply lines 21a, and an associated one of the light-emission control lines 14e as shown in FIG. 4. In addition, the third TFT 9c includes the semiconductor layer 12b, the gate insulation film 13, the gate electrode 14b, the first interlayer insulation film 15, the second interlayer insulation film 17, and the source electrode 18c and the drain electrode 18d, all of which are sequentially provided on the base coat film 11, as shown in FIG. 3. Here, the semiconductor layer 12b is provided on the base coat film 11 and similarly to the semiconductor layer 12a, has a channel region, a source region, and a drain region, as shown in FIG. 3. In addition, the gate insulation film 13 is provided so as to cover the semiconductor layer 12b as shown in FIG. 3. In addition, the gate electrode 14b is provided on the gate insulation film 13 so as to overlap the channel region of the semiconductor layer 12b as shown in FIG. 3. In addition, the first interlayer insulation film 15 and the second interlayer insulation film 17 are sequentially provided so as to cover the gate electrode 14b as shown in FIG. 3. In addition, the source electrode 18c and the drain electrode 18d are provided on the second interlayer insulation film 17 so as to be separated by a distance from each other as shown in FIG. 3. In addition, the source electrode 18c and the drain electrode 18d are electrically connected respectively to the source region and the drain region of the semiconductor layer 12b via contact holes formed through the stack of the gate insulation film 13, the first interlayer insulation film 15, and the second interlayer insulation film 17 as shown in FIG. 3. In addition, the drain electrode 18d is electrically connected to the relay electrode 21b via a contact hole formed through the first planarization film 19a and the third interlayer insulation film 20a as shown in FIG. 3.

Note that the present embodiment discusses an example where the first TFTs 9a, the second TFTs 9b, and the third TFTs 9c are all top-gate TFTs. Alternatively, the first TFTs 9a, the second TFTs 9b, and the third TFTs 9c may be bottom-gate TFTs.

In each subpixel P, the capacitor 9d is electrically connected to an associated one of the first TFTs 9a and an associated one of the power supply lines 21a as shown in FIG. 4. Here, the capacitor 9d includes: the lower conductive layer 14c; the first interlayer insulation film 15 provided so as to cover the lower conductive layer 14c and the upper conductive layer 16a provided on the first interlayer insulation film 15 so as to overlap the lower conductive layer 14c, as shown in FIG. 3. Note that the upper conductive layer 16a is electrically connected to the power supply line 21a via a contact hole (not shown) formed through the second interlayer insulation film 17, the first planarization film 19a, and the third interlayer insulation film 20a.

The first planarization film 19a, the second planarization film 21a, and an edge cover 32a (which is described later) are made of, for example, an organic resin material such as a polyimide resin, an acrylic resin, or a novolac resin.

The third interlayer insulation film 20a is provided as an inorganic insulation film and made of, for example, a monolayer film of, for example, silicon nitride, silicon oxide, or silicon oxynitride or a stack of any of these monolayer films.

The organic EL element layer 35 includes a plurality of first electrodes 31a, the edge cover 32a, the plurality of organic EL layers 33, and the second electrode 34, all of which are sequentially stacked on the TFT layer 30, as shown in FIG. 3.

The plurality of first electrodes 31a are arranged in a matrix on the second planarization film 22a in such a manner as to correspond to the plurality of subpixels P as shown in FIG. 3. Here, each first electrode 31a is electrically connected to the drain electrode 18d of an associated one of the third TFTs 9c via a contact hole formed through the first planarization film 19a and the third interlayer insulation film 20a, the relay electrode 21b, and a contact hole formed through the second planarization film 22a as shown in FIG. 3. In addition, the first electrode 31a has a function of injecting holes to the organic EL layers 33. In addition, the first electrode 31a is more preferably made of a material that has a large work function to improve the efficiency of hole injection to the organic EL layers 33. Here, the first electrode 31a is made of, for example, a metal material such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), or tin (Sn). Alternatively, the first electrode 31a may be made of, for example, an alloy such as an astatine-astatine oxide (At—AtO$_2$) alloy. As another alternative, the first electrode 31a may be made of, for example, an electrically conductive oxide such as tin oxide (SnO), zinc oxide (ZnO), indium tin oxide (ITO), or indium zinc oxide (IZO). In addition, the first electrode 31a may include a stack of layers of any of these materials. Note that examples of compound materials that have a large work function include indium tin oxide (ITO) and indium zinc oxide (IZO).

The edge cover 32a is provided in a lattice form commonly to the plurality of subpixels P, so as to cover the peripheral end portion of each first electrode 31a as shown in FIG. 3.

The plurality of organic EL layers 33 are provided on the plurality of first electrodes 31a and arranged in a matrix in such a manner as to correspond to the plurality of subpixels P as shown in FIG. 3. Here, each organic EL layer 33, as shown in FIG. 5, includes a hole injection layer 1, a hole transport layer 2, a light-emitting layer 3, an electron transport layer 4, and an electron injection layer 5, all of which are sequentially provided on the first electrode 31a.

The hole injection layer 1 is alternatively referred to as an anode buffer layer and provided as a common functional layer that has a function of bringing the energy levels of the first electrode 31a and the organic EL layer 33 closer together to improve the efficiency of hole injection from the first electrode 31a to the organic EL layer 33 and that is common to the plurality of subpixels P. Here, the hole injection layer 1 is made of, for example, a triazole derivative, an oxadiazole derivative, an imidazole derivative, a polyaryl alkane derivative, a pyrazoline derivative, a phenylenediamine derivative, an oxazole derivative, a styryl anthracene derivative, a fluorenone derivative, a hydrazone derivative, or a stilbene derivative.

The hole transport layer 2 has a function of improving the efficiency of hole transport from the first electrode 31a to the organic EL layer 33 and is provided as a common functional layer that is common to the plurality of subpixels P. Here, the hole transport layer 2 is made of, for example, a porphyrin derivative, an aromatic tertiary amine compound, a styryl amine derivative, polyvinyl carbazole, poly-p-phenylene vinylene, polysilane, a triazole derivative, an oxadiazole derivative, an imidazole derivative, a polyaryl alkane derivative, a pyrazoline derivative, a pyrazolone derivative, a phenylenediamine derivative, an aryl amine derivative, an amine-substituted chalcone derivative, an oxazole derivative, a styryl anthracene derivative, a fluorenone derivative, a hydrazone derivative, a stilbene derivative, hydrogenated amorphous silicon, hydrogenated amorphous silicon carbide, zinc sulfide, or zinc selenide.

The light-emitting layer 3 is provided as an individual functional layer for each subpixel P and is injected with holes and electrons from the first electrode 31a and the second electrode 34 respectively when the light-emitting layer 3 is under voltage applied by the first electrode 31a and the second electrode 34. These holes and electrons recombine in the light-emitting layer 3. Here, the light-emitting layer 3 is made of a material that has a high luminous efficiency. The light-emitting layer 3 is made of, for example, a metal oxinoid compound (8-hydroxy quinoline metal complex), a naphthalene derivative, an anthracene derivative, a diphenyl ethylene derivative, a vinyl acetone derivative, a triphenyl amine derivative, a butadiene derivative, a coumarin derivative, a benzoxazole derivative, an oxadiazole derivative, an oxazole derivative, a benzimidazole derivative, a thiadiazole derivative, a benzothiazole derivative, a styryl derivative, a styryl amine derivative, a bis(styryl)benzene derivative, a tris(styryl)benzene derivative, a perylene derivative, a perynone derivative, an aminopyrene derivative, a pyridine derivative, a rhodamine derivative, an acridine derivative, phenoxazone, a quinacridone derivative, rubrene, poly-p-phenylene vinylene, or polysilane.

The electron transport layer 4 is provided as a common functional layer that has a function of efficiently transporting electrons to the light-emitting layer 3 and that is common to the plurality of subpixels P. Here, the electron transport layer 4 is made of, for example, an organic compound such as an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, or a metal oxinoid compound.

The electron injection layer 5 has a function of bringing the energy levels of the second electrode 34 and the organic EL layer 33 closer together to improve the efficiency of electron injection from the second electrode 34 to the organic EL layer 33. This function can lower the drive voltage of the organic EL elements in the organic EL element layer 35. Note that the electron injection layer 5 is alternatively referred to as the cathode buffer layer and provided as a common functional layer that is common to the plurality of subpixels P. Here, the electron injection layer 5 is made of, for example, an inorganic alkali compound such as lithium fluoride (LiF), magnesium fluoride (MgF$_2$), calcium fluoride (CaF$_2$), strontium fluoride (SrF$_2$), or barium fluoride (BaF$_2$); aluminum oxide (Al$_2$O$_3$); or strontium oxide (SrO).

The second electrode 34 is, as shown in FIG. 3, provided so as to cover the organic EL layers 33 and the edge cover 32a commonly to the plurality of subpixels P. In addition, the second electrode 34 has a function of injecting electrons to the organic EL layers 33. In addition, the second electrode 34 is more preferably made of a material that has a small work function to improve the efficiency of electron injection to the organic EL layers 33. Here, the second electrode 34 is made of, for example, silver (Ag), aluminum (Al), vanadium (V), calcium (Ca), titanium (Ti), yttrium (Y), sodium Na), manganese (Mn), indium (In), magnesium (Mg), lithium (Li), ytterbium (Yb), or lithium fluoride (LiF). Alternatively, the second electrode 34 may be made of, for example, an alloy such as a magnesium-copper (Mg—Cu) alloy, a magnesium-silver (Mg—Ag) alloy, a sodium-potassium (Na—K) alloy, an astatine-astatine oxide (At—AtO$_2$) alloy, a lithium-aluminum (Li—Al) alloy, a lithium-calcium-aluminum (Li—Ca—Al) alloy, or a lithium fluoride-calcium-aluminum (LiF—Ca—Al) alloy. As another alternative, the second electrode 34 may be made of, for example, an electrically conductive oxide such as tin oxide (SnO), zinc oxide (ZnO), indium tin oxide (ITO), or indium zinc oxide (IZO). As a further alternative, the second electrode 34 may include a stack of layers of any of these materials. Note that examples of materials that have a small work function include magnesium (Mg), lithium (Li), lithium fluoride (LiF), magnesium-copper (Mg—Cu), magnesium-silver (Mg—Ag), sodium-potassium (Na—K), lithium-aluminum (Li—Al), lithium-calcium-aluminum (Li—Ca—Al), and lithium fluoride-calcium-aluminum (LiF—Ca—Al).

As shown in FIGS. 3, 6, 7, and 10, the sealing film 40 is provided so as to cover the second electrode 34, includes a first inorganic sealing film 36, an organic sealing film 37, and a second inorganic sealing film 38, all of which are sequentially stacked on the second electrode 34, and has a function of protecting the organic EL layers 33 in the organic EL element layer 35 from, for example, water and oxygen. Here, the first inorganic sealing film 36 and the second inorganic sealing film 38 are made of, for example, an inorganic insulation film such as a silicon nitride film, a silicon oxide film, or a silicon oxynitride film. In addition, the organic sealing film 37 is made of, for example, an organic resin material such as an acrylic resin, an epoxy resin, a silicone resin, a polyurea resin, a parylene resin, a polyimide resin, or a polyamide resin.

In addition, the organic EL display device 50a, as shown in FIG. 1, includes, in the frame area F: a first outer damming wall Wa provided, external to the trench G, like a rectangular frame surrounding the display area D; and a second outer damming wall Wb provided like a rectangular frame surrounding the first outer damming wall Wa.

The first outer damming wall Wa, as shown in FIGS. 6 and 7, includes: a bottom-level resin layer 22b made of the same material and in the same layer as the second planarization film 22a; and a top-level resin layer 32b made of the same material and in the same layer as the edge cover 32a. Note that the first outer damming wall Wa is, as shown in FIGS. 6 and 7, provided so as to overlap an outer peripheral portion of the organic sealing film 37 in the sealing film 40 and structured so as to restrain ink that will form the organic sealing film 37 in the sealing film 40 from spreading.

The second outer damming wall Wb, as shown in FIGS. 6 and 7, includes: a bottom-level resin layer 19b made of the same material and in the same layer as the first planarization film 19a; a mid-level resin layer 22c made of the same material and in the same layer as the second planarization film 22a; and a top-level resin layer 32c made of the same material and in the same layer as the edge cover 32a.

In addition, the organic EL display device 50a, as shown in FIG. 1, includes, in the frame area F, a first frame line 18b that has: a portion extending like a band with a relatively large width where the trench G is open; a portion extending linearly internal to the trench G on the display area D side; and two ends extending to the terminal section T opposite the display area D. Here, the first frame line 18h is electrically connected to the power supply line 21a on the display area D side of the frame area to be fed with a high-voltage power supply (ELVDD) at the terminal section T. Note that the first frame line 18h and a second frame line 18i (which is described later) are made of the same material and in the same layer as the source electrodes 18a and 18c and the drain electrodes 18b and 18d as shown in FIGS. 6 and 7.

In addition, the organic EL display device 50a, as shown in FIG. 1, includes, in the frame area F, the second frame line 18i provided external to the trench G so as to form a generally C-shape and having two ends extending to the terminal section T. Here, the second frame line 18i is, as shown in FIG. 6, electrically connected to the second electrode 34 via a first conductive layer 31b formed in the trench G to be fed with a low-voltage power supply (ELVSS) at the terminal section T. Note that the first conductive layer 31b is made of the same material and in the same layer as the first electrode 31a and provided, in the frame area F, so as to overlap the second frame line 18i and the second electrode 34 to electrically connect the second frame line 18i and the second electrode 34, as shown in FIG. 6.

In addition, the organic EL display device 50a, as shown in FIG. 8, includes, in the bending portion B of the frame area F: an injection resin layer 8a provided so as to fill a slit S formed in the base coat film 11, the gate insulation film 13, the first interlayer insulation film 15, and the second interlayer insulation film 17; a plurality of routing lines 18j provided on the injection resin layer 8a and the second interlayer insulation film 17; and a covering resin layer 19c provided so as to cover the routing lines 18j. Note that the slit S is provided, as shown in FIG. 8, like a groove that runs through the base coat film 11, the gate insulation film 13, the first interlayer insulation film 15, and the second interlayer insulation film 17 and that passes all the way through in the direction in which the bending portion B extends so as to expose the surface of the resin substrate layer 10. In addition, the injection resin layer 8a is made of, for example, an organic resin material such as a polyimide resin. In addition, the plurality of routing lines 18j are provided so as to extend parallel to each other in a direction perpendicular to the direction in which the bending portion B extends. Here, both ends of each routing line 18j are, as shown in FIG. 8, electrically connected respectively to a first gate conductive layer 14f and a second gate conductive layer 14g via contact holes formed through a stack of the first interlayer insulation film 15 and the second interlayer insulation film 17. Note that the routing lines 18j are made of the same material and in the same layer as the source electrodes 18a and 18c and the drain electrodes 18b and 18d. In addition, the first gate conductive layer 14f is, as shown in FIG. 8, provided between the gate insulation film 13 and the first interlayer insulation film 15 and electrically connected to the signal lines (e.g., the gate lines 14d and the source lines 18f) extending in the display area D. In addition, the second gate conductive layer 14g is, as shown in FIG. 8, provided between the gate insulation film 13 and the first interlayer insulation film 15 and electrically connected to, for example, a terminal of the terminal section T. In addition, the covering resin layer 19c is made of the same material and in the same layer as the first planarization film 19a.

In addition, the organic EL display device 50a, as shown in FIG. 10, includes, in the frame area F and the non-display area N, a plurality of peripheral photo spacers 32d provided on the second planarization film 22a in an insular manner so as to project upward in the drawing. Here, the peripheral photo spacers 32d are made of the same material and in the same layer as the edge cover 32a.

In addition, the organic EL display device 50a, as shown in FIGS. 9 and 10, includes, in the non-display area N, a separation wall Ea provided like a circular frame surrounding the through hole H.

The separation wall Ea, as shown in FIG. 10, includes: a wall base portion 19da made of the same material and in the same layer as the first planarization film 19a and provided like a circular frame; and a wall top portion 20ba made of the same material and in the same layer as the third interlayer insulation film 20a and provided like a circular frame on the wall base portion 19da. Here, the wall top portion 20ba is, as shown in FIG. 10, provided like a brim so as to project for example, approximately 2 μm out of the wall base portion 19da from the display area D side toward the through hole H side.

Owing to the separation wall Ea described here, the second electrode 34 (the hole injection layer 1, the hole transport layer 2, the electron transport layer 4, and the electron injection layer 5) is, as shown in FIG. 10, provided on the wall top portion 20ba all across from the display area D to the through hole H and separated from a through hole H side portion in the peripheral end portion of the wall top portion 20ba on the through hole H side. Note that although FIG. 10 does not show the hole injection layer 1, the hole transport layer 2, the electron transport layer 4, and the electron injection layer 5, the common functional layer containing the hole injection layer 1, the hole transport layer 2, the electron transport layer 4, and the electron injection layer 5 is, similarly to the second electrode 34, separated from a through hole H side portion in the peripheral end portion of the wall top portion 20ba on the through hole H side. Here, in the non-display area N, the second inorganic sealing film 38 in the sealing film 40 is, as shown in FIG. 10, provided so as to cover the separation wall Ea via the first inorganic sealing film 36 in the sealing film 40. In addition, the first inorganic sealing film 36 is, as shown in FIG. 10, provided in contact with the second interlayer insulation film 17 in the TFT layer 30 on the through hole H side of the separation wall Ea in the non-display area N.

In addition, the organic EL display device 50a, as shown in FIGS. 9 and 10, includes, in the non-display area N, a first inner damming wall We and a second inner damming wall Wd both provided like a circular frame surrounding the separation wall Ea.

The first inner damming wall Wc, as shown in FIG. 10, includes: a first resin layer 22e made of the same material and in the same layer as the second planarization film 22a; and a second resin layer 32e provided on the first resin layer 22e and made of the same material and in the same layer as the edge cover 32a. Here, the first inner damming wall We is, as shown in FIG. 10, provided in the display area D side of the non-display area N so as to overlap an inner peripheral portion of an organic insulation film 37 that forms the sealing film 40.

The second inner damming wall Wd, as shown in FIG. 10, includes: a first resin layer 22f made of the same material and in the same layer as the second planarization film 22a; and a second resin layer 32f provided on the first resin layer 22f and made of the same material and in the same layer as the edge cover 32a. Here, the second inner damming wall Wd is, as shown in FIGS. 9 and 10, provided between the first inner damming wall We and the separation wall Ea in the non-display area N.

In the non-display area N, the gate insulation film 13, the first interlayer insulation film 15, and the second interlayer insulation film 17 are, as shown in FIG. 10, provided so as not to reach a side face of the through hole H. Here, in a peripheral portion of the through hole H, as shown in FIG. 10, a semiconductor layer 12c is provided as an etch stopper in such a manner as to be exposed from the gate insulation film 13, the first interlayer insulation film 15, and the second interlayer insulation film 17. Note that the semiconductor layer 12c is made of the same material and in the same layer as the semiconductor layers 12a and 12b. In addition, FIG. 10 shows, as an example, a structure where the base coat film 11 and the semiconductor layer 12c are provided to remain as an inorganic film in the TFT layer 30 in a peripheral portion of the through hole H. Alternatively, it may be only the base coat film 11 that remains. As another alternative, the base coat film 11 and the semiconductor layer 12c may be provided so as not to reach a side face of the through hole H, exposing the resin substrate layer 10. Here, in a peripheral portion of the through hole H, a thin inorganic film is preferably formed to restrain cracks propagating in the inorganic film.

In the organic EL display device 50a described so far, in each subpixel P, a gate signal is fed to the first TFT 9a via the gate line 14d, turning on the first TFT 9a. A prescribed voltage corresponding to a source signal is hence written via the source line 18f to the gate electrode 14b of the second TFT 9b and the capacitor 9d. A light-emission control signal is fed to the third TFT 9c via the light-emission control line 14e, turning on the third TFT 9c. A current in accordance with the gate voltage of the second TFT 9b is fed from the power supply line 21a to the organic EL layer 33, causing the light-emitting layer 3 in the organic EL layer 33 to emit light, to produce an image display. Note that in the organic EL display device 50a, the gate voltage of the second TFT 9b is retained by the capacitor 9d when the first TFT 9a is turned off. The light-emitting layer 3 in the subpixel P therefore continuously emits light until a gate signal is fed in a next frame.

Figure 11:
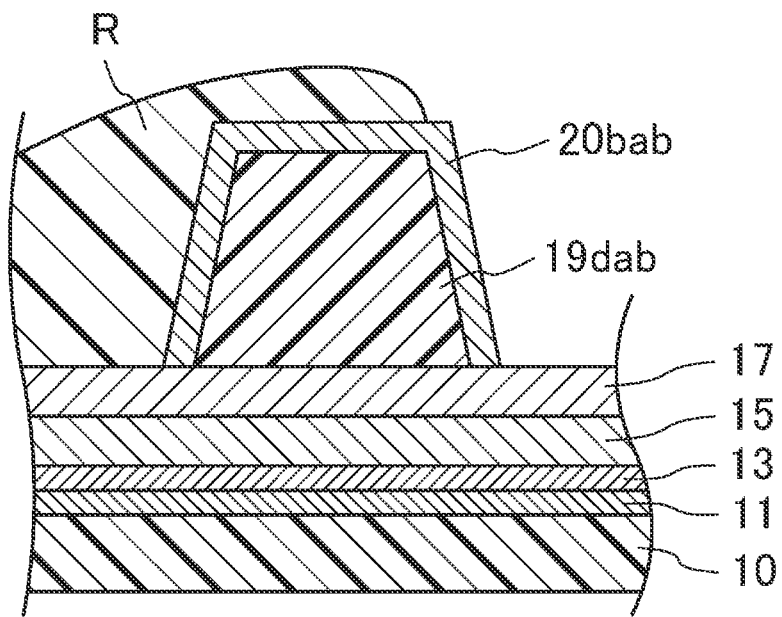
FIG. 11 is a cross-sectional view illustrating a part of a separation wall forming step in a method of manufacturing the organic EL display device in accordance with the first embodiment of the disclosure.
Figure 12:
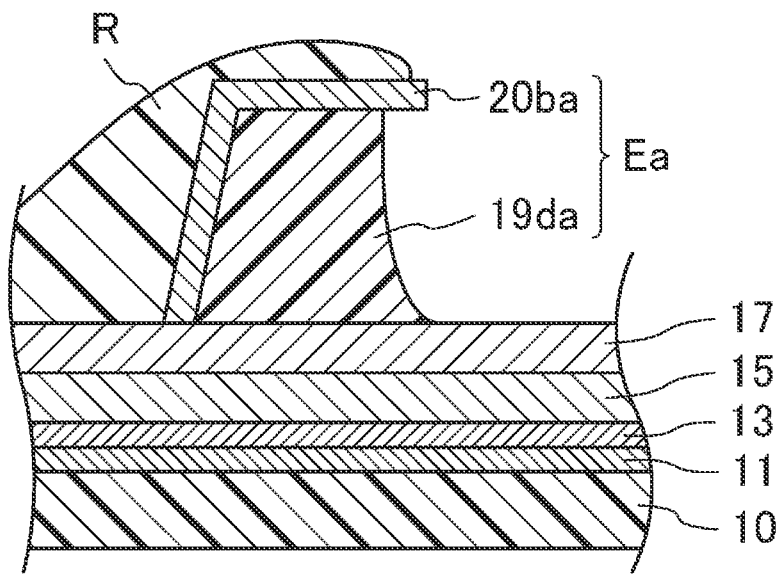
FIG. 12, continuing from FIG. 11, is a cross-sectional view illustrating a part of the separation wall forming step in the method of manufacturing the organic EL display device in accordance with the first embodiment of the disclosure.

A description is given next of a method of manufacturing the organic EL display device 50a in accordance with the present embodiment. The method of manufacturing the organic EL display device 50a in accordance with the present embodiment includes a TFT layer forming step, an organic EL element layer forming step, a sealing film forming step, and a through hole forming step. The TFT layer forming step includes a separation wall forming step. Note that FIGS. 11 and 12 are cross-sectional views illustrating parts of the separation wall forming step in the method of manufacturing the organic EL display device 50a.

TFT Layer Forming Step

As an example, the base coat film 11, the first TFTs 9a, the second TFTs 9b, the third TFTs 9c, the capacitors 9d, the first planarization film 19a, the third interlayer insulation film 20a, the power supply lines 21a, and the second planarization film 22a are provided by a well-known method on a surface of the resin substrate layer 10 formed on a glass substrate, to form the TFT layer 30.

The following will describe a separation wall forming step of forming the separation wall Ea in forming the first planarization film 19a and the third interlayer insulation film 20a in the TFT layer forming step.

First, a photosensitive polyimide resin is applied by, for example, spin-coating to a surface of a substrate on which, for example, the source electrodes 18a and 18c and the drain electrodes 18b and 18d are formed. After forming a photosensitive resin film, this photosensitive resin film is subjected to optical exposure, development, and baking, to form the first planarization film 19a in the display area D, and the bottom-level resin layer 19b and the coveting resin layer 19c are formed in the frame area F, to form a wall base portion forming layer 19dab (see FIG. 11) in the non-display area N.

Subsequently, a silicon oxynitride film (of a thickness of approximately 10 nm to 500 nm) is formed by, for example, plasma CVD (chemical vapor deposition) on a surface of a substrate on which, for example, the first planarization film 19a is formed. After forming an inorganic insulation film, this inorganic insulation film is patterned to form the third interlayer insulation film 20a in the display area D, thereby forming a wall top portion forming layer 20bab in the non-display area N as shown in FIG. 11.

Furthermore, as shown in FIG. 11, after forming a resist pattern R on the wall top portion forming layer 20bab, those end portions of the wall top portion forming layer 20bab and the wall base portion forming layer 19dab which are exposed from the resist pattern R are removed by, for example, dry etching, to form the wall top portion 20ba and the wall base portion 19da as shown in FIG. 12. Hence, the separation wall Ea is formed which includes the wall base portion 19da and the wall top portion 20ba provided like a brim on the wall base portion 19da.

Organic EL Element Layer Forming Step

The first electrode 31a, the edge cover 32a, the organic EL layers 33 (the hole injection layer 1, the hole transport layer, the light-emitting layer 3, the electron transport layer 4, and the electron injection layer 5), and the second electrode 34 are formed by a well-known method on the second planarization film 22a in the ITT layer 30 formed in the foregoing TFT layer forming step, to form the organic EL element layer 35. Here, in forming the organic EL layer 23 and the second electrode 34 by vapor deposition, the hole injection layer 1, the hole transport layer 2, the electron transport layer 4 and the electron injection layer 5, and the second electrode 34, all of which will form an organic EL layer 23, are, in the brim-shaped portion of the wall top portion 20ba of the separation wall Ea, formed separated from the side where the through hole H will be formed later.

Sealing Film Forming Step

First, for example, an inorganic insulation film such as a silicon nitride film, a silicon oxide film, or a silicon oxynitride film is formed by plasma CVD using a mask on a surface of a substrate on which the organic EL element layer 35 is formed in the foregoing organic EL element layer forming step, to form the first inorganic sealing film 36.

Subsequently, a film of an organic resin material such as an acrylic resin is formed by, for example, inkjet technology, on a surface of a substrate on which the first inorganic sealing film 36 is formed, to form the organic sealing film 37.

Thereafter, the second inorganic sealing film 38 is formed by forming an inorganic insulation film such as a silicon nitride film, a silicon oxide film, or a silicon oxynitride film by plasma CVD using a mask on a substrate on which the organic sealing film 37 is formed, to form the sealing film 40.

Through Hole Forming Step

First, after attaching a protection sheet (not shown) to a surface of a substrate on which the sealing film 40 is formed in the foregoing sealing film forming step, the glass substrate is detached from the bottom face of the resin substrate layer 10 under the laser light shone from the glass substrate side of the resin substrate layer 10. Furthermore, a protection sheet (not shown) is attached to the bottom face of the resin substrate layer 10 from which the glass substrate has been detached.

Subsequently, the through hole H is formed by, for example, shining circularly scanning laser light onto the region overlapping the semiconductor layer 12c internal to the separation wall Ea provided in the resin substrate layer 10 to which the protection sheet is attached.

Thereafter, when the organic EL display device 50a in which the through hole H is formed is, for example, fixed inside a housing, the electronic components 60 such as a camera and a fingerprint sensor are mounted so that the electronic components 60 are disposed on the backside of the through hole H.

The organic EL display device 50a in accordance with the present embodiment can be thus manufactured.

As described above, in the organic EL display device 50a in accordance with the present embodiment, in the insular non-display area N where the through hole H is formed internal to the display area D, the separation wall Ea is provided like a circular frame extending along the rim of the through hole H. Here, the separation wall Ea includes: the frame-shaped wall base portion 19da made of the same material and in the same layer as the first planarization film 19a; and the wall top portion 20ba provided on the wall base portion 19da like a brim projecting from the display area D side toward the through hole H side and made of the same material and in the same layer as the third interlayer insulation film 20a. Hence, the common functional layer (the hole injection layer 1, the hole transport layer 2, the electron transport layer 4, and the electron injection layer 5) and the second electrode 34 are formed separated into the display area D side and the through hole H side in that portion of the separation wall Ea which projects like a brim. The step of forming a resist pattern and the step of dry etching using this resist pattern do not need to be repeated a plurality of times to form the separation wall Ea. Therefore, the common functional layer (the hole injection layer 1, the hole transport layer 2, the electron transport layer 4, and the electron injection layer 5) and the second electrode 34 can be formed separated into the display area D side and the through hole H side at low cost.

In addition, in the organic EL display device 50a in accordance with the present embodiment, the second inorganic sealing film 38 is provided in the non-display area N so as to cover the separation wall Ea via the first inorganic sealing film 36. In addition, the first inorganic sealing film 36 is provided in contact with the second interlayer insulation film 17 in the TFT layer 30 in the non-display area. N. This structure can ensure the sealing capability of the sealing film 40 even in the non-display area N, thereby restraining degradation of the organic EL layers 33 and improving the reliability of the organic EL display device 50a.

SECOND EMBODIMENT

Figure 13:
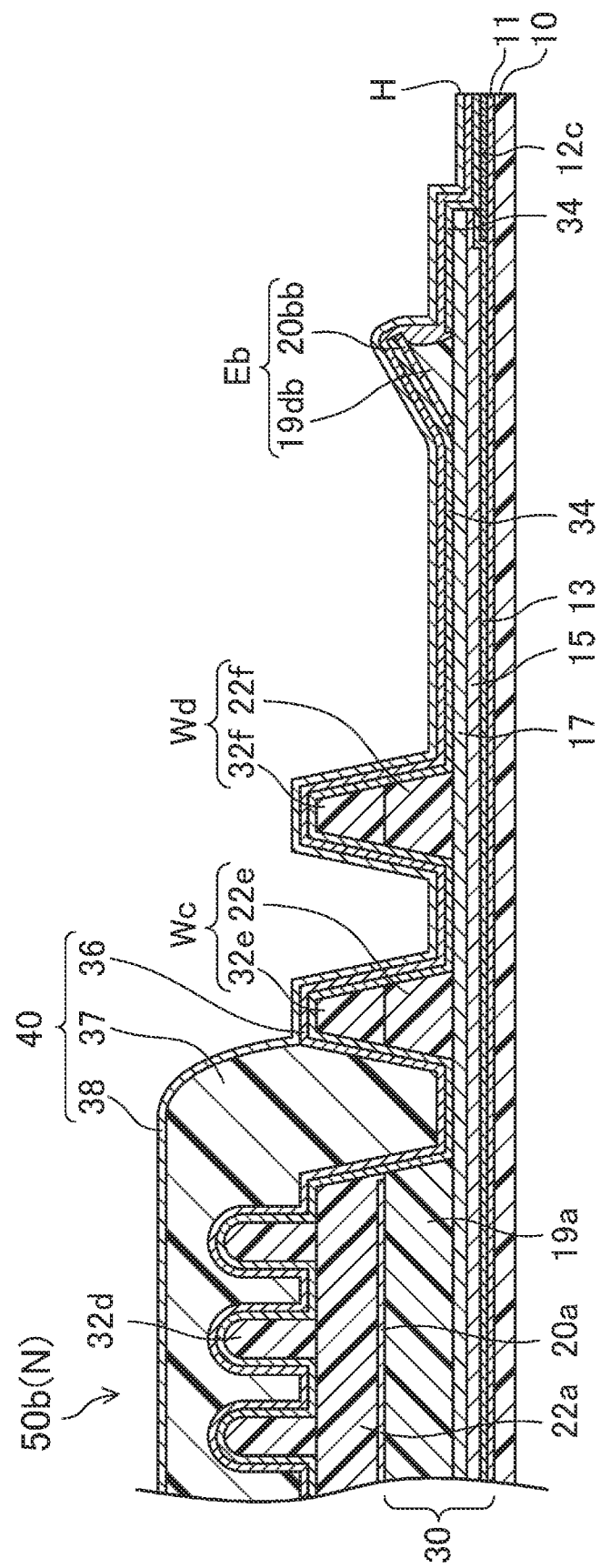
FIG. 13 is a cross-sectional view of a non-display area of an organic EL display device in accordance with a second embodiment of the disclosure, corresponding to FIG. 10.
Figure 14:
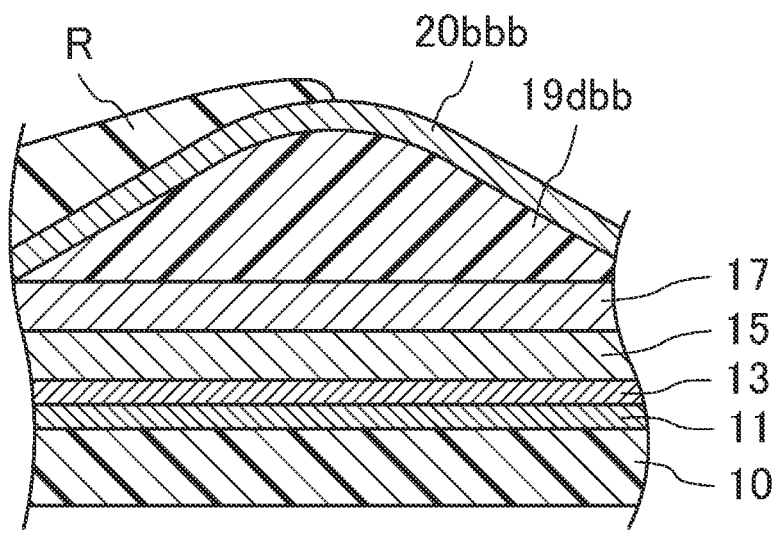
FIG. 14 is a cross-sectional view illustrating a part of a separation wall forming step in a method of manufacturing the organic EL display device in accordance with the second embodiment of the disclosure, corresponding to FIG. 11.
Figure 15:
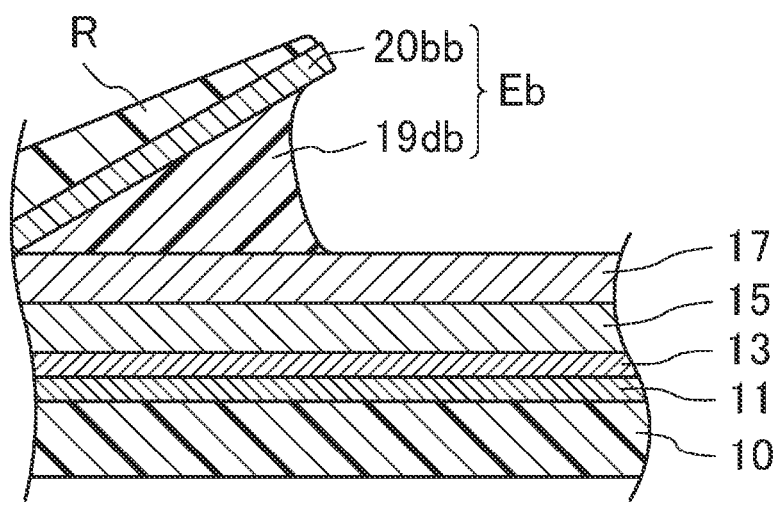
FIG. 15, continuing from FIG. 14, is a cross-sectional view illustrating a part of the separation wall forming step in the method of manufacturing the organic EL display device in accordance with the second embodiment of the disclosure, corresponding to FIG. 12.

FIGS. 13 to 15 represent a second embodiment of the display device of the disclosure. Here, FIG. 13 is a cross-sectional view of a non-display area N of an organic EL display device 50b in accordance with the present embodiment, corresponding to FIG. 10. In addition, FIGS. 14 and 15 are cross-sectional views illustrating parts of a separation wall forming step in a method of manufacturing the organic EL display device 50b, corresponding to FIGS. 11 and 12. Note that members of this and subsequent embodiments that are the same as those shown in FIGS. 1 to 12 are indicated by the same reference signs or numerals, and detailed description thereof is omitted.

The first embodiment above discussed, as an example, the organic EL display device 50a in which the wall base portion 19da of the separation wall Ea has a top face formed parallel to the top face of the resin substrate layer 10. In contrast, the present embodiment discusses, as an example, the organic EL display device 50b in which a wall base portion 19db of a separation wall Eb has a top face tilted with respect to the top face of the resin substrate layer 10.

The organic EL display device 50b, similarly to the organic EL display device 50a in accordance with the first embodiment described above, has: a display area D in which the insular non-display area N is provided; and a frame area F surrounding the display area D.

The organic EL display device 50b, similarly to the organic EL display device 50a in accordance with the first embodiment described above, includes: a resin substrate layer 10; a TFT layer 30 on the resin substrate layer 10; an organic EL element layer 35 on the TFT layer 30; and a sealing film 40 on the organic EL element layer 35.

The display area D and the frame area F of the organic EL display device 50b has substantially the same structure as the display area D and the frame area F of the organic EL display device 50a in accordance with the first embodiment described above.

The organic EL display device Sob, similarly to the organic EL display device 50a in accordance with the first embodiment described above, includes the separation wall Eb provided in the non-display area N like a circular frame surrounding the through hole H as shown in FIG. 13.

The separation wall Eb, as shown in FIG. 13, includes: the wall base portion 19db made of the same material and in the same layer as the first planarization film 19a and provided like a circular frame; and a wall top portion 20bb made of the same material and in the same layer as the third interlayer insulation fill 20a and provided like a circular frame on the wall base portion 19db. Here, the wall base portion 19db has a top face tilted by, for example, 30° with respect to the top face of the resin substrate layer 10, so that the through hole H side (right-hand side in the drawing) is higher than the display area D side (left-hand side in the drawing), as shown in FIG. 13. In addition, the wall top portion 20bb is provided like such a brim as to tilt as much as the tilt of the top face of the wall base portion 19db (e.g., 30°) with respect to the wall base portion 19db and as to project, for example, approximately 2 μm from the display area D side toward the through hole side, as shown in FIG. 13.

Owing to the separation wall Eb described here, the second electrode 34, (the hole injection layer 1, the hole transport layer 2, the electron transport, layer 4, and the electron injection layer 5) is, as shown in FIG. 13, provided on the wall top portion 20bb all across from the display area D to the through hole H and separated from a through hole H side portion in the peripheral end portion of the wall top portion 20bb on the through hole H side. Note that although FIG. 13 does not show the hole injection layer 1, the hole transport layer 2, the electron transport layer 4, and the electron injection layer 5, the common functional layer containing the hole injection layer 1, the hole transport, layer 2, the electron transport layer 4, and the electron injection layer 5 is, similarly to the second electrode 34, separated from a through hole H side portion in the peripheral end portion of the wall top portion 20bb on the through hole H side. Here, in the non-display area N, the second inorganic sealing film 38 in the sealing film 40 is, as shown in FIG. 13, provided so as to cover the separation wall Eb via the first inorganic sealing film 36 in the sealing film 40. In addition, the first inorganic sealing film 36 is, as shown in FIG. 13, provided in contact with the second interlayer insulation film 17 in the TFT layer 30 on the through hole H side of the separation wall Eb in the non-display area N.

Similarly to the organic EL display device 50a in accordance with the first embodiment described above, the organic E display device 50b, as shown in FIG. 13, includes, in the non-display area N, a first inner damming wall We and a second inner damming wall Wd both provided like a circular frame surrounding the separation wall Eb.

In the non-display area N, the gate insulation film 13, the first interlayer insulation film 15, and the second interlayer insulation film 17 are, as shown in FIG. 13, provided so as not to reach a side face of the through hole H. Here, in a peripheral portion of the through hole H, as shown in FIG. 13, a semiconductor layer 12c is provided as an etch stopper in such a manner as to be exposed from the gate insulation film 13, the first interlayer insulation film 15, and the second interlayer insulation film 17.

The organic EL display device 50b described above is, similarly to the organic EL display device 50a in accordance with the first embodiment described above, flexible and so structured as to cause, via the first TFT 9a, the second TFT 9b, and the third TFT 9c, the light-emitting layer 3 in the organic EL layer 33 to emit light in each subpixel P in a suitable manner, to produce an image display.

The organic EL display device 50b in accordance with the present embodiment can be manufactured by forming the separation wall Eb, with the shape of the wall base portion forming layer 19dab being changed to the shape of a wall base portion forming layer 19dbb in the TFT layer forming step in the method of manufacturing the organic EL display device 50a in accordance with the first embodiment described above (see FIGS. 14 and 15).

Specifically, first, a photosensitive polyimide resin is applied by, for example, spin-coating to a surface of a substrate on which, for example, the source electrodes 18a and 18c and the drain electrodes 18b and 18d are formed. After forming a photosensitive resin film, this photosensitive resin film is subjected to optical exposure, development, and baking, to form the first planarization film 19a in the display area D, and the bottom-level resin layer 19b and the covering resin layer 19c are formed in the frame area F, to form the wall base portion forming layer 19dbb (see FIG. 14) in the non-display area N. Note that in exposing this photosensitive resin film to light, the wall base portion forming layer 19dbb that has a chevron-shaped lateral cross-section can be formed through the half exposure of a portion that will become the wall base portion forming layer 19dbb by using, for example, a halftone mask or a gray tone mask.

Subsequently, a silicon oxynitride film (of a thickness of approximately 10 nm to 500 nm) is formed by, for example, plasma CND on a surface of a substrate on which, for example, the first planarization film 19a is formed. After forming an inorganic insulation film, this inorganic insulation film is patterned to form the third interlayer insulation film 20a in the display area D, thereby forming a wall top portion forming layer 20bbb in the non-display area N as shown in FIG. 14.

Furthermore, as shown in FIG. 14, after forming the resist pattern R on the wall top portion forming layer 20bbb, those end portions of the wall top portion forming layer 20bbb and the wall base portion forming layer 19dbb which are exposed from the resist pattern R are removed by, for example, dry etching, to form the wall top portion 20bb and the wall base portion 19db as shown in FIG. 15. Hence, the separation wall Eb is formed which includes the wall base portion 19db and the wall top portion 20bb provided like a brim on the wall base portion 19db.

As described above, in the organic EL display device 50b in accordance with the present embodiment, in the insular non-display area N where the through hole H is formed internal to the display area D, the separation wall Eb is provided like a circular frame extending along the rim of the through hole H. Here, the separation wall Eb includes: the frame-shaped wall base portion 19db made of the same material and in the same layer as the first planarization film 19a; and the wall top portion 20bb provided on the wall base portion 19db like a brim projecting from the display area D side toward the through hole H side and made of the same material and in the same layer as the third interlayer insulation film 20a. Hence, the common functional layer (the hole injection layer 1, the hole transport layer 2, the electron transport layer 4, and the electron injection layer 5) and the second electrode 34 are formed separated into the display area D side and the through hole H side in that portion of the separation wall Eb which projects like a brim. The step of forming a resist pattern and the step of dry etching using this resist pattern do not need to be repeated a plurality of times to form the separation wall Eb. Therefore, the common functional layer (the hole injection layer 1, the hole transport layer 2, the electron transport layer 4, and the electron injection layer 5) and the second electrode 34 can be formed separated into the display area D side and the through hole H side at low cost.

In addition, in the organic EL display device 50b in accordance with the present embodiment, the second inorganic sealing film 38 is provided in the non-display area N so as to cover the separation wall Eb via the first inorganic sealing film 36. In addition, the first inorganic sealing film 36 is provided in contact with the second interlayer insulation film 17 in the TFT layer 30 in the non-display area N. This structure can ensure the sealing capability of the sealing film 40 even in the non-display area N, thereby restraining degradation of the organic EL layers 33 and improving the reliability of the organic EL display device 50b.

In addition, in the organic EL display device 50b in accordance with the present embodiment, the top face of the wall base portion 19db is tilted in such a manner that the through hole H side is higher than the display area D side, and the wall top portion 20bb projects in such a manner as to tilt as much as the tilt of the top face of the wall base portion 19db. Therefore, the magnitude of the side shift in the dry etching of the wall base portion forming layer 19dbb can be reduced. Here, the organic EL display device 50a in accordance with the first embodiment described above requires, for example, a 2-μm side shift to form a 2-μm projection on the wall top portion 20ba. In contrast, the organic EL display device 50b in accordance with the present embodiment requires no more than a 1.7-μm side shift to form a 2-μm projection on the wall base portion 19db.

THIRD EMBODIMENT

Figure 16:
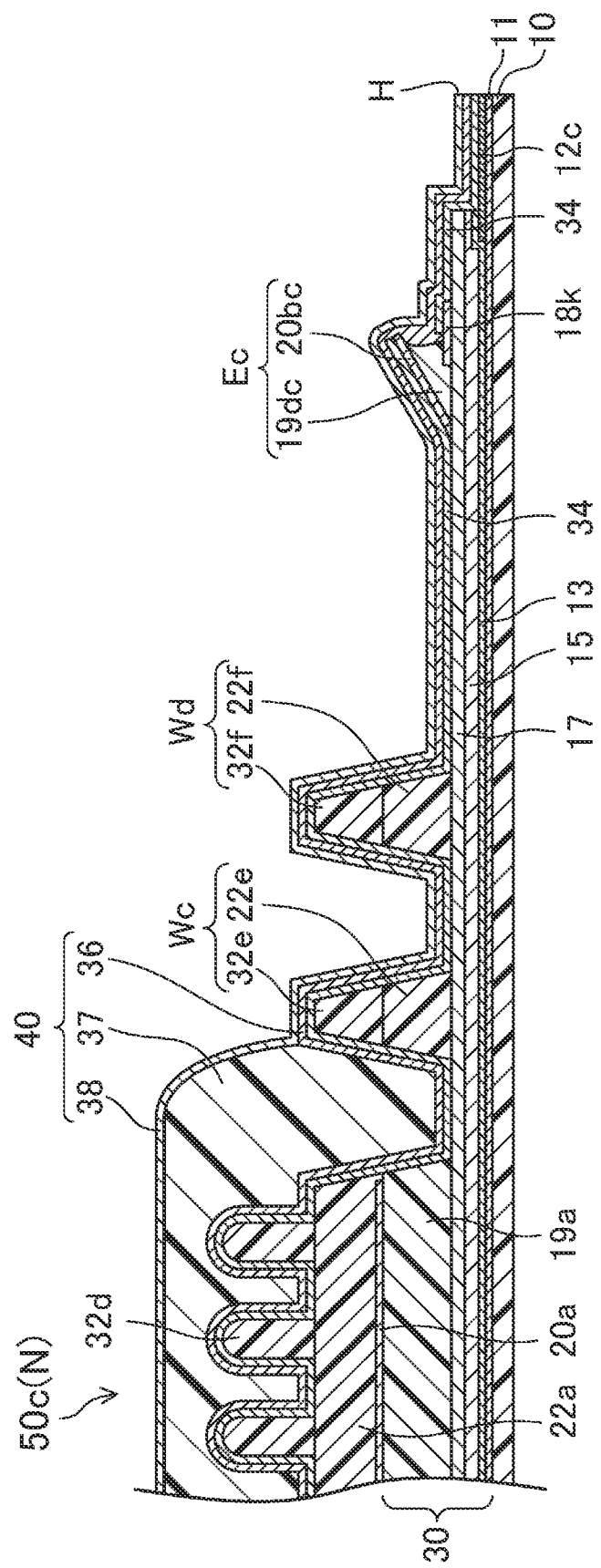
FIG. 16 is a cross-sectional view of a non-display area of an organic EL display device in accordance with a third embodiment of the disclosure, corresponding to FIG. 10.
Figure 17:
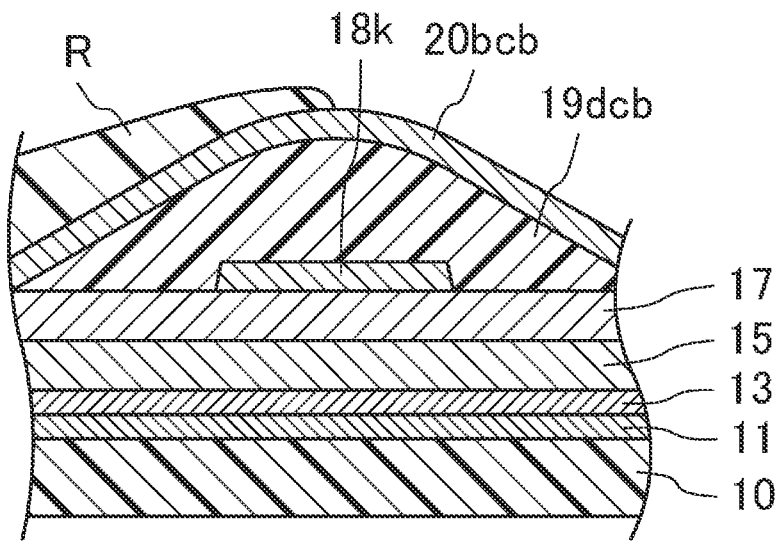
FIG. 17 is a cross-sectional view illustrating a part of a separation wall forming step in a method of manufacturing the organic EL display device in accordance with the third embodiment of the disclosure, corresponding to FIG. 11.
Figure 18:
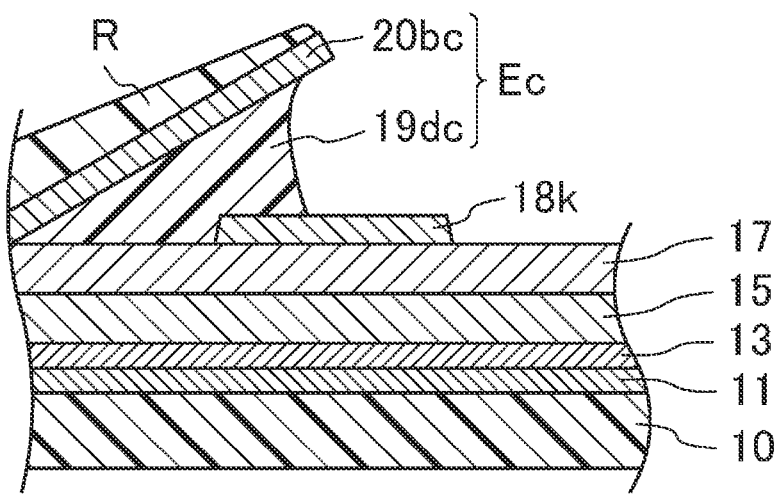
FIG. 18, continuing from FIG. 17, is a cross-sectional view illustrating a part of the separation wall forming step in the method of manufacturing the organic EL display device in accordance with the third embodiment of the disclosure, corresponding to FIG. 12.

FIGS. 16 to 18 represent a third embodiment of the display device of the disclosure. Here, FIG. 16 is a cross-sectional view of a non-display area N of an organic EL display device 50c in accordance with the present embodiment, corresponding to FIG. 10. In addition, FIGS. 17 and 18 are cross-sectional views illustrating parts of a separation wall forming step in a method of manufacturing the organic EL display device 50c, corresponding to FIGS. 11 and 12.

The second embodiment above discussed, as an example, the organic EL display device 50b including the separation wall Eb in which the wall base portion 19db is formed on the second interlayer insulation film 17. In contrast, the present embodiment discusses, as an example, the organic EL display device 50c including a separation wall Ec in which a wall base portion 19dc is formed on a second interlayer insulation film 17 via a metal layer 18k.

The organic EL display device 50c, similarly to the organic EL display device 50a in accordance with the first embodiment described above, has: a display area D in which the insular non-display area N is provided; and a frame area F surrounding the display area D.

The organic EL display device 50c, similarly to the organic EL display device 50a in accordance with the first embodiment described above, includes: a resin substrate layer 10; a TFT layer 30 on the resin substrate layer 10; an organic EL element layer 35 on the TFT layer 30; and a sealing film 40 on the organic EL element layer 35.

The display area D and the frame area F of the organic EL display device 50c has substantially the same structure as the display area D and the frame area F of the organic EL display device 50a in accordance with the first embodiment described above.

The organic EL display device 50c, similarly to the organic EL display device 50a in accordance with the first embodiment described above, includes the separation wall Ec provided in the non-display area N like a circular frame surrounding the through hole H as shown in FIG. 16.

The separation wall Ec, as shown in FIG. 16, includes: the wall base portion 19dc made of the same material and in the same layer as the first planarization film 19a and provided like a circular frame; and a wall top portion 20bc made of the same material and in the same layer as the third interlayer insulation film 20a and provided like a circular frame on the wall base portion 19dc. Here, the wall base portion 19dc has a top face tilted by, for example, 30° with respect to the top face of the resin substrate layer 10, so that the through hole H side (right-hand side in the drawing) is higher than the display area side (left-hand side in the drawing), as shown in FIG. 16. In addition, the wall top portion 20bc is provided like such a brim as to tilt as much as the tilt of the top face of the wall base portion 19dc (e.g., 30° with respect to the wall base portion 19dc and as to project, for example, approximately 2 μm from the display area D side toward the through hole H side, as shown in FIG. 16. In addition, in the separation wall Ec, on the resin substrate layer 10 side of the wall base portion 19dc on the through hole Hi side, the metal layer 18k is provided like a circular frame surrounding the through hole H as shown in FIG. 16, In addition, the metal layer 18k, on the through hole H side thereof, is exposed from the wall base portion 19dc as shown in FIG. 16. In addition, the metal layer 18k is provided so as to overlap the end portions of the wall top portion 20bc on the through hole H side. Note that the metal layer 18k is made of, for example, a stack of metal films in which a titanium film (of a thickness of approximately 10 nm to 200 nm), an aluminum film (of a thickness of approximately 100 nm to 1,000 nm), and another titanium film (of a thickness of approximately 10 nm to 200 nm) are sequentially stacked and also that the metal layer 18k is made of the same material and in the same layer as the wiring layers such as the source electrodes 18a and 18c and the drain electrodes 18b and 18d.

Owing to the separation wall Ec described here, the second electrode 34, (the hole injection layer 1, the hole transport layer 2, the electron transport layer 4, and the electron injection layer 5) is, as shown in FIG. 16, provided on the wall top portion 20bc all across from the display area D to the through hole H and separated from a through hole H side portion in the peripheral end portion of the wall top portion 20bc on the through hole H side. Note that although FIG. 16 does not show the hole injection layer 1, the hole transport layer 2, the electron transport layer 4, and the electron injection layer 5, the common functional layer containing the hole injection layer 1, the hole transport layer 2, the electron transport layer 4, and the electron injection layer 5 is, similarly to the second electrode 34, separated from a through hole H side portion in the peripheral end portion of the wall top portion 20bc on the through hole H side. Here, in the non-display area N, the second inorganic sealing film 38 in the sealing film 40 is, as shown in FIG. 16, provided so as to cover the separation wall Ec via the first inorganic sealing film 36 in the sealing film 40. In addition, the first inorganic sealing film 36 is, as shown in FIG. 16, provided in contact with the second interlayer insulation film 17 in the TFT layer 30 on the through hole H side of the separation wall Ec in the non-display area N.

Similarly to the organic EL display device 50a in accordance with the first embodiment described above, the organic EL display device 50c, as shown in FIG. 16, includes, in the non-display area N, a first inner damming wall We and a second inner damming wall Wd both provided like a circular frame surrounding the separation wall Ec.

In the non-display area N, the gate insulation film 13, the first interlayer insulation film 15, and the second interlayer insulation film 17 are, as shown in FIG. 16, provided so as not to reach a side face of the through hole H. Here, in a peripheral portion of the through hole H, as shown in FIG. 16, a semiconductor layer 12c is provided as an etch stopper in such a manner as to be exposed from the gate insulation film 13, the first interlayer insulation film 15, and the second interlayer insulation film 17.

The organic EL display device 50c described above is, similarly to the organic EL display device 50a in accordance with the first embodiment described above, flexible and so structured as to cause, via the first TFT 9a, the second TFT 9b, and the third TFT 9c, the light-emitting layer 3 in the organic EL layer 33 to emit light in each subpixel P in a suitable manner, to produce an image display.

The organic EL display device 50c in accordance with the present embodiment can be manufactured by forming the metal layer 18k in forming, for example, the source electrodes 18a and 18c and the drain electrodes 18b and 18d and also by forming the separation wall Ec, with the shape of the wall base portion forming layer 19dab being changed to the shape of a wall base portion forming layer 19dcb in the TFT layer forming step in the method of manufacturing the organic EL display device 50a in accordance with the first embodiment described above (see FIGS. 17 and 18).

Specifically, first, the metal layer 18k is formed in the non-display area N in forming, for example, the source electrodes 18a and 18c and the drain electrodes 18b and 18d.

Subsequently, a photosensitive polyimide resin is applied by, for example, spin-coating to a surface of a substrate on which, for example, the source electrodes 18a and 18c and the drain electrodes 18b and 18d are formed. After forming a photosensitive resin film, this photosensitive resin film is subjected to optical exposure, development, and baking, to form the first planarization film 19a in the display area D, and the bottom-level resin layer 19b and the covering resin layer 19c are formed in the frame area F, to form the wall base portion forming layer 19dcb (see FIG. 17) in the non-display area N. Note that in exposing this photosensitive resin film to light, the wall base portion forming layer 19dcb that has a chevron-shaped lateral cross-section can be formed through half exposure of a portion that will become the wall base portion forming layer 19dcb by using, for example, a halftone mask or a gray tone mask.

Subsequently, a silicon oxynitride film (of a thickness of approximately 10 nm to 500 nm) is formed by, for example, plasma CVD on a surface of a substrate on which, for example, the first planarization film 19a is formed. After forming an inorganic insulation film, this inorganic insulation film is patterned to form the third interlayer insulation film 20a in the display area D, thereby forming a wall top portion forming layer 20bcb in the non-display area N as shown in FIG. 17.

Furthermore, as shown in FIG. 17, after forming the resist pattern R on the wall top portion forming layer 20bcb, those end portions of the wall top portion forming layer 20bcb and the wall base portion forming layer 19dcb which are exposed from the resist pattern R are removed by, for example, dry etching, to form the wall top portion 20bc and the wall base portion 19dc as shown in FIG. 18. Hence, the separation wall Ec is formed which includes the wall base portion 19dc and the wall top portion 20bc provided like a brim on the wall base portion 19dc.

As described above, in the organic EL display device 50c in accordance with the present embodiment, in the insular non-display area. N where the through hole H is formed internal to the display area D, the separation wall Ec is provided like a circular frame extending along the rim of the through hole H. Here, the separation wall Ec includes: the frame-shaped wall base portion 19dc made of the same material and in the same layer as the first planarization film 19a; and the wall top portion 20bc provided on the wall base portion 19dc like a brim projecting from the display area D side toward the through hole H side and made of the same material and in the same layer as the third interlayer insulation film 20a. Hence, the common functional layer (the hole injection layer 1, the hole transport layer 2, the electron transport layer 4, and the electron injection layer 5) and the second electrode 34 are formed separated into the display area D side and the through hole H side in that portion of the separation wall Ec which projects like a brim. The step of forming a resist pattern and the step of dry etching using this resist pattern do not need to be repeated a plurality of times to form the separation wall Ec. Therefore, the common functional layer (the hole injection layer 1, the hole transport layer 2, the electron transport layer 4, and the electron injection layer 5) and the second electrode 34 can be formed separated into the display area D side and the through hole H side at low cost.

In addition, in the organic EL display device 50c in accordance with the present embodiment, the second inorganic sealing film 38 is provided so as to cover the separation wall Ec via the first inorganic sealing film 36 in the non-display area N. In addition, the first inorganic sealing film 36 is provided in contact with the second interlayer insulation film 17 in the TFT layer 30 in the non-display area N. This structure can ensure the sealing capability of the sealing film 40 even in the non-display area N, thereby restraining degradation of the organic EL layers 33 and improving the reliability of the organic EL display device 50c.

In addition, in the organic EL display device 50c in accordance with the present embodiment, the top face of the wall base portion 19dc is tilted in such a manner that the through hole H side is higher than the display area D side, and the wall top portion 20bc projects in such a manner as to tilt as much as the tilt of the top face of the wall base portion 19dc. Therefore, the magnitude of the side shift in the dry etching of the wall base portion forming layer 19dcb can be reduced.

In addition, in the organic EL display device 50c in accordance with the present embodiment, on the resin substrate layer 10 side of the wall base portion 19dc on the through hole H side, the metal layer 18k is provided like a circular frame surrounding the through hole H. Therefore, the wall base portion forming layer 19dcb that has a chevron-shaped lateral cross-section can be more easily formed than in the organic EL display device 50b in accordance with the second embodiment described above.

OTHER EMBODIMENTS

The foregoing embodiments have discussed, as an example, organic EL layers with a 5-layered structure including a hole injection layer, a hole transport layer, a light-emitting layer, an electron transport layer, and an electron injection layer. Alternatively, the organic EL layer may have, for example, a 3-layered structure including a hole injection and transport layer, a light-emitting layer, and an electron transport and injection layer.

In addition, the foregoing embodiments have discussed, as an example, organic EL display devices including a first electrode as an anode and a second electrode as a cathode. The disclosure is equally applicable to organic EL display devices in which the layered structure of the organic EL layer is reversed, to include a first electrode as a cathode and a second electrode as an anode.

In addition, the foregoing embodiments have discussed, as an example, organic EL display devices in which the TFT connected to the first electrode has an electrode as a drain electrode. The disclosure is equally applicable to organic EL display devices in which the TFT connected to the first electrode has an electrode referred to as a source electrode.

In addition, the foregoing embodiments have discussed organic EL display devices as an example of the display device. The disclosure is equally applicable to display devices including a plurality of current-driven light-emitting elements, for example, applicable to display devices including QLEDs (quantum-dot light-emitting diodes) which are light-emitting elements using a quantum-dot layer.

INDUSTRIAL APPLICABILITY

As described above, the disclosure is useful in flexible display devices.

The invention claimed is:

1. A display device comprising:
   a base substrate;
   a thin film transistor layer on the base substrate;
   a planarization film and an inorganic insulation film being sequentially stacked on the thin film transistor layer; and
   a light-emitting element layer on the thin film transistor layer, the light-emitting element layer including a plurality of first electrodes, a plurality of functional layers, and a common second electrode sequentially stacked in such a manner as to correspond to a plurality of subpixels in a display area, wherein
   an insular non-display area is provided internal to the display area,
   a through hole extends in a direction of a thickness of the base substrate in the non-display area,
   a separation wall is provided in the non-display area so as to surround the through hole, and
   the separation wall includes:
      a wall base portion made of a same material and in a same layer as the planarization film and provided like a frame; and
      a wall top portion made of a same material and in a same layer as the inorganic insulation film and provided on the wall base portion like a brim projecting from a display area side toward a through hole side, wherein
   the wall base portion has a top face tilted so that the through hole side is higher than the display area side, and
   the wall top portion tilts as much as a tilt of the top face of the wall base portion,
   a sealing film in which a first inorganic sealing film, an organic sealing film, and a second inorganic sealing film are sequentially stacked is provided on the light-emitting element layer, and
   the second inorganic sealing film is provided so as to cover the separation wall via the first inorganic sealing film in the non-display area.

2. The display device according to claim 1, wherein
   the thin film transistor layer includes an additional inorganic insulation film on a base substrate side of the planarization film, and
   the first inorganic sealing film is provided in contact with the additional inorganic insulation film in the non-display area.

3. The display device according to claim 1, wherein an inner damming wall is provided in the non-display area like a frame so as to surround the separation wall and to overlap an inner peripheral portion of the organic sealing film.

4. The display device according to claim 1, wherein
   a frame area is provided around the display area, and
   an outer damming wall is provided in the frame area like a frame so as to surround the display area and to overlap an outer peripheral portion of the organic sealing film.

5. The display device according to claim 1, wherein
   the thin film transistor layer includes a wiring layer on a base substrate side of the planarization film, and
   in the separation wall, a metal layer made of a same material and in a same layer as the wiring layer is provided on a base substrate side of the wall base portion on the through hole side.

6. The display device according to claim 5, wherein the metal layer is exposed from the wall base portion on the through hole side.

7. The display device according to claim 5, wherein the metal layer is provided so as to overlap an end portion of the wall top portion on the through hole side.

8. The display device according to claim 5, wherein the metal layer is provided like a frame so as to surround the through hole.

9. The display device according to claim 5, wherein the metal layer is made of a stack of metal films.

10. The display device according to claim 1, wherein the through hole contains an electronic component.

11. The display device according to claim 10, wherein the electronic component is a camera or a fingerprint sensor.

12. The display device according to claim 1, wherein the functional layers are organic electroluminescence layers.

13. The display device according to claim 1, wherein
   the plurality of functional layers include a common functional layer provided commonly to the plurality of subpixels, and
   the common functional layer and the second electrode are provided on the separation wall all across from the display area to the non-display area and separated from a through hole side portion in an end portion of the wall top portion on the through hole side.

* * * * *